(12) United States Patent
Chae et al.

(10) Patent No.: US 8,987,803 B2
(45) Date of Patent: Mar. 24, 2015

(54) THREE DIMENSIONAL SEMICONDUCTOR MEMORY DEVICES AND METHODS OF MANUFACTURING THE SAME

(75) Inventors: Soodoo Chae, Yongin-si (KR); Kihyun Hwang, Seongnam-si (KR); Hanmei Choi, Seoul (KR); SeungHyun Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 13/425,584

(22) Filed: Mar. 21, 2012

(65) Prior Publication Data

US 2012/0267701 A1 Oct. 25, 2012

(30) Foreign Application Priority Data

Apr. 19, 2011 (KR) ........................ 10-2011-0036353

(51) Int. Cl.
  *H01L 29/78* (2006.01)
  *H01L 27/115* (2006.01)
  *G11C 5/02* (2006.01)
  *G11C 16/04* (2006.01)

(52) U.S. Cl.
  CPC ...... *H01L 27/11582* (2013.01); *H01L 27/1157* (2013.01); *G11C 5/02* (2013.01); *G11C 16/0483* (2013.01)
  USPC ....... 257/324; 257/E29.255; 257/40; 257/200

(58) Field of Classification Search
  USPC .................................................. 257/319–324
  See application file for complete search history.

(56) References Cited

U.S. PATENT DOCUMENTS

| 8,008,722 B2* | 8/2011 | Kim et al. ..................... 257/347 |
| 8,299,521 B2* | 10/2012 | Lee et al. ..................... 257/326 |
| 2010/0155818 A1 | 6/2010 | Cho et al. |
| 2010/0163968 A1* | 7/2010 | Kim et al. ..................... 257/324 |
| 2010/0181612 A1 | 7/2010 | Kito et al. |
| 2011/0147824 A1* | 6/2011 | Son et al. ..................... 257/324 |

FOREIGN PATENT DOCUMENTS

| JP | 2010-171185 | 8/2010 |
| KR | 10-2010-0074543 A | 7/2010 |
| KR | 10-2010-0095900 A | 9/2010 |

* cited by examiner

*Primary Examiner* — David Vu
*Assistant Examiner* — Jonathan Han
(74) *Attorney, Agent, or Firm* — Myers Bigel Sibley & Sajovec, PA

(57) ABSTRACT

Nonvolatile memory devices include a vertical stack of nonvolatile memory cells. The vertical stack of nonvolatile memory cells includes a first nonvolatile memory cell having a first gate pattern therein, which is separated from a vertical active region by a first multi-layered dielectric pattern having a first thickness, and a second nonvolatile memory cell having a second gate pattern therein, which is separated from the vertical active region by a second multi-layered dielectric pattern having a second thickness. The second gate pattern is also separated from the first gate pattern by a distance less than a sum of the first and second thicknesses.

12 Claims, 31 Drawing Sheets

THREE DIMENSIONAL SEMICONDUCTOR MEMORY DEVICES AND METHODS OF MANUFACTURING THE SAME

REFERENCE TO PRIORITY APPLICATION

This U.S. non-provisional patent application claims priority under 35 U.S.C. §119 to Korean Patent Application No. 10-2011-0036353, filed Apr. 19, 2011, the disclosure of which is hereby incorporated herein by reference.

FIELD

The present disclosure herein relates to semiconductor devices and methods of manufacturing the same and, more particularly, to three-dimensional semiconductor memory devices and methods of manufacturing the same.

BACKGROUND

Semiconductor devices are becoming more highly integrated to meet the requirements of customers, e.g., in order to provide high performance and low cost. The integration density of the semiconductor devices is a factor that may directly influence the cost of the semiconductor devices. Thus, the semiconductor devices have been continuously scaled down.

SUMMARY

Nonvolatile memory devices according to embodiments of the present invention support higher memory cell integration levels by using asymmetric gate patterns within vertical stacks of nonvolatile memory cells. According to some of these embodiments of the invention, a vertical stack of nonvolatile memory cells is provided on a substrate. The vertical stack of nonvolatile memory cells includes a first nonvolatile memory cell having a first gate pattern therein, which is separated from a vertical active region by a first multi-layered dielectric pattern having a first thickness, and a second nonvolatile memory cell having a second gate pattern therein, which is separated from the vertical active region by a second multi-layered dielectric pattern having a second thickness. The second gate pattern is also separated from the first gate pattern by a distance less than a sum of the first and second thicknesses. According to some of these embodiments of the invention, the first multi-layered dielectric pattern includes: (i) a first tunnel insulating layer on the vertical active region, (ii) a first charge storage layer on the first tunnel insulating layer, (iii) a first barrier layer on the first charge storage layer; and (iv) a first metal oxide layer on the first barrier layer. In addition, the first and second gate patterns may be vertically separated from each other by the first metal oxide layer, which may contact first and second surfaces of the first and second gate patterns, respectively. These first and second gate patterns may be immediately adjacent gate patterns within the vertical stack of nonvolatile memory cells and the first and second surfaces of the first and second gate patterns may face each other. In some of these embodiments, the first and second surfaces of the first and second gate patterns may be separated from each other by a distance less than or equal to the first thickness.

According to additional embodiments of the invention, the second multi-layered dielectric pattern includes a second tunnel insulating layer on the vertical active region, a second charge storage layer on the second tunnel insulating layer, a second barrier layer on the second charge storage layer and a second metal oxide layer on the second barrier layer. In these embodiments of the invention, the first and second gate patterns may be vertically separated from each other by the first tunnel insulating layer, the first charge storage layer, the first barrier layer, the first metal oxide layer and the second metal oxide layer, but not the second tunnel insulating layer, the second charge storage layer or the second barrier layer.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

Figure 1:
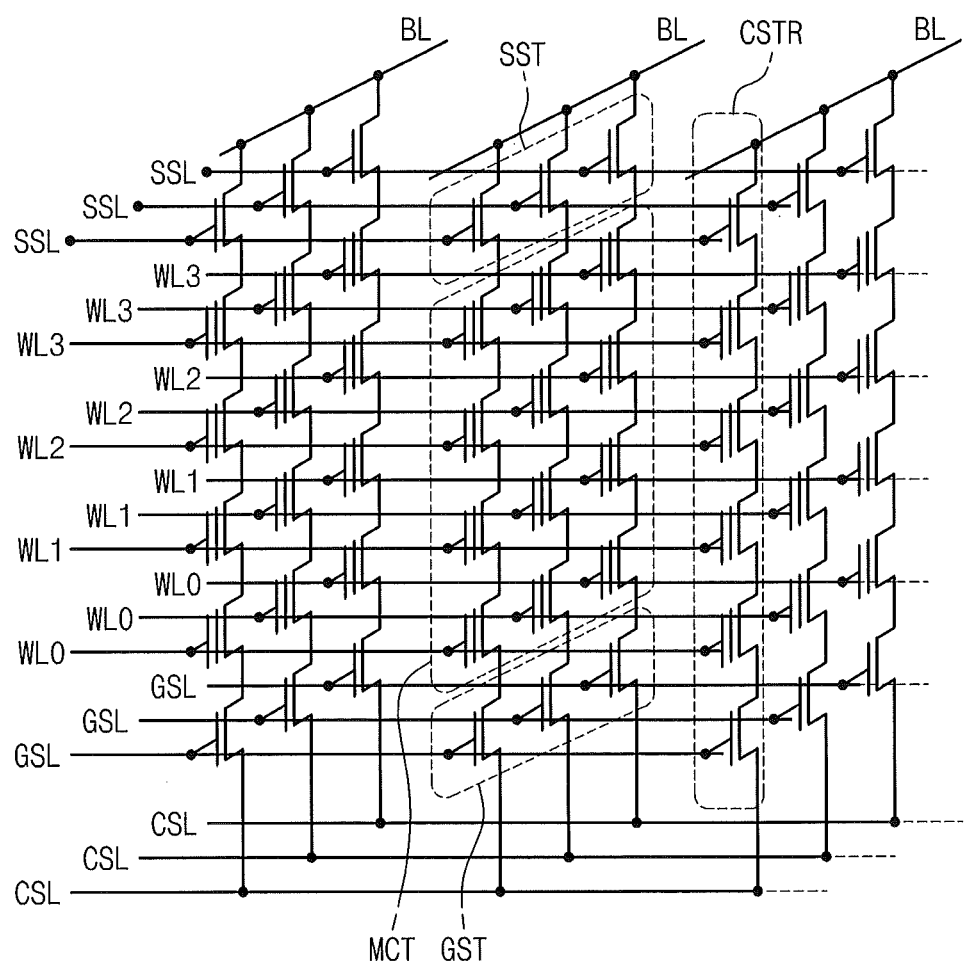
FIG. 1 is an equivalent circuit diagram illustrating a portion of a three-dimensional semiconductor memory device according to exemplary embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

It will be understood that although the terms first, second, etc. may be used herein to describe various elements, these elements should not be limited by these terms. These terms are only used to distinguish one element from another. Thus, a first element could be termed a second element without departing from the teachings of the present embodiments. Exemplary embodiments illustrated herein may include their complementary counterparts. The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram illustrating a portion of a three-dimensional semiconductor memory device according to exemplary embodiments. Referring to FIG. 1, a cell array of a three-dimensional semiconductor memory device according to exemplary embodiments may include common source lines CSL, a plurality of bit lines BL, and a plurality of cell strings CSTR disposed between the common source lines CSL and the bit lines BL. The bit lines BL may be two dimensionally arrayed, and some of the cell strings CSTR may be in parallel connected to one of the bit lines BL. Further, some of the cell strings CSTR may be connected to one of the common source lines CSL. That is, some of the cell strings CSTR may be disposed between the plurality of bit lines BL and one of the common source lines CSL. According to an embodiment, the common source lines CSL may be two dimensionally arrayed. The common source lines CSL may be electrically connected to each other and may be simultaneously controlled to have the same electrical bias, for example, the same voltage. Alternatively, the common source lines CSL may be isolated from each other and may be independently controlled.

Each of the cell strings CSTR may be configured to include a ground selection transistor GST connected to one of the common source lines CSL, a string selection transistor SST connected to one of the bit lines BL, and a plurality of memory cell transistors MCT disposed between the ground selection transistor GST and the string selection transistor SST. The ground selection transistor GST, the plurality of memory cell transistors MCT and the string selection transistor SST constituting each of the cell strings CSTR may be serially connected to each other.

One of the common source lines CSL may be connected to sources of some of the ground selection transistors GST. In addition, gate electrodes of the ground selection transistors GST may extend to form ground selection lines GSL, and gate electrodes of the string selection transistors SST may extend to form string selection lines SSL. Further, gate electrodes of the memory cell transistors MCT may extend to form word lines WL0 to WL3. The ground selection lines GSL, the string selection lines SSL and the word lines WL0 to WL3 may be disposed between the common source lines CSL and the bit lines BL. Each of the memory cell transistors MCT may act as a data storage element. Some of the cell strings CSTR may be in parallel connected to one of the bit lines. Thus, the cell strings CSTR may be two dimensionally arrayed.

Some of the cell strings CSTR may share one of the string selection lines SSL, a set of word lines WL0 to WL3, and one of the ground selection lines GSL. Each of the cell strings CSTR may include a vertical active pattern (118 of FIG. 2A) that vertically extends from the common source line CSL to be electrically connected to the bit line BL. The vertical active patterns of the cell strings CSTR may penetrate the ground selection lines GSL, the word lines WL0 to WL3 and the string selection lines SSL. Dielectric patterns may be disposed in respective ones of spaces between the word lines WL0 to WL3 and the vertical active patterns.

Dielectric layers acting as gate insulation layers may be disposed between the ground selection lines GSL and the vertical active patterns as well as between the string selection lines SSL and the vertical active patterns. The vertical active patterns, the ground selection lines GSL, the word lines WL0 to WL3 and the string selection lines SSL may constitute metal-oxide-semiconductor field effect transistors (MOSFETs) that employ the vertical active patterns as channel regions. Meanwhile, the ground selection lines GSL, the word lines WL0 to WL3 and the string selection lines SSL may correspond to gate lines. Thus, the vertical active patterns and the gate lines GSL, WL0 to WL3 and SSL may constitute MOS capacitors.

The ground selection lines GSL may act as the gate electrodes of the ground selection transistors, and the string selection lines SSL may act as the gate electrodes of the string selection transistors SST. Further, the word lines WL0 to WL3 may act as the gate electrodes of the memory cell transistors MCT. In the event the transistors SST, MCT and GST are N-channel MOSFETs and high voltages (for example, gate voltages higher than threshold voltages of the transistors SST, MCT and GST) are applied to the gate lines GSL, WL0 to WL3 and SSL, inversion layers (i.e., channel regions) may be formed in the active pattern adjacent to the gate lines GSL, WL0 to WL3 and SSL. Further, these inversion layers may extend even into the active patterns between the gate lines GSL, WL0 to WL3 and SSL. This is due to fringing fields generated by the high voltages applied to the gate lines GSL, WL0 to WL3 and SSL. Thus, if the vertical distances between the gate lines GSL, WL0 to WL3 and SSL are reduced, the inversion layers formed in the active pattern may be vertically and electrically connected to form a current path that electrically connects the corresponding common source line CSL to the corresponding bit line BL. Consequently, each of the cell strings CSTR may have a configuration that the ground selection transistor GST (i.e., a lower selection transistor), the plurality of memory cell transistors MCT and the string selection transistor SST (i.e., an upper selection transistor) are serially connected to each other. In addition, each of the memory cell transistors MCT may correspond to a unit memory cell.

Now, a method of operating the three-dimensional semiconductor memory device described with reference to FIG. 1 will be described. However, the method of operating the three-dimensional semiconductor memory device is not limited to the following descriptions. That is, the operation methods may be embodied in different forms and should not be construed as limited to the embodiments set forth herein.

First, a program method for writing data into a selected memory cell transistor will be described. The word lines located at the same level may be electrically connected to each other. Thus, the same voltage may be applied to the word lines located at the same level. For example, all the word lines WL0 may have the same electrical potential, and all the word lines WL1 may have the same electrical potential. Similarly, all the word lines WL2 may have the same electrical potential, and all the word lines WL3 may have the same electrical potential. Meanwhile, a voltage applied to the word lines located at a first level may be equal to or different from a voltage applied to the word lines located at a second level which is lower or higher than the first level.

A program voltage $V_{PGM}$ may be applied to the word lines WL0, WL1, WL2 or WL3 located at the same level as the selected memory cell transistor MCT, and a pass voltage $V_{PASS}$ may be applied to the word lines other than the selected word lines. The program voltage $V_{PGM}$ may be, for example, a high voltage of about 10V to about 20V, and the pass voltage $V_{PASS}$ may be, for example, a voltage which is lower than the program voltage $V_{PGM}$ but is nonetheless sufficient to turn on the memory cell transistors MCT. Further, a ground voltage may be applied to the bit line BL connected to the selected memory cell transistor, and a power voltage $V_{CC}$ may be applied to the other bit lines BL. In addition, all the ground selection lines GSL may be grounded to turn off all the ground selection transistors GST. Moreover, the power voltage $V_{CC}$ may also be applied to the string selection line SSL connected to the cell string CSTR including the selected memory cell transistor MCT, and the other string selection lines SSL may be grounded.

Under the program bias condition described above, all the memory cell transistors MCT and the string selection transistor SST in the cell string CSTR connected to the bit line BL having the ground voltage and the string selection line SSL having the power voltage $V_{cc}$ may be turned on. Thus, the channel regions of the memory cell transistors MCT of the selected cell string CSTR may have the same potential (e.g., a ground voltage) as the grounded bit line BL. As a result, the selected memory cell transistor MCT may be programmed by an F-N tunneling phenomenon since the high program voltage $V_{PGM}$ is directly applied between the word line and the channel region of the selected memory cell transistor MCT.

Now, a read operation for reading out the data stored in the memory cell transistors MCT will be described. In the read mode, the same voltage may also be applied to the word lines located at the same level, as described in the program operation. Further, a voltage applied to the word lines located at a first level may be equal to or different from a voltage applied to the word lines located at a second level which is lower or higher than the first level, as described in the program operation. Specifically, for the read operation, a ground voltage may be applied to the word lines connected to at least one selected memory cell transistor located at a certain level, and a read voltage $V_{READ}$ may be applied to the other word lines. The read voltage $V_{READ}$ may be a voltage which is capable of turning on non-selected memory cell transistors. That is, even though the non-selected memory cell transistors include programmed memory cell transistors having a higher threshold voltage than that of initial memory cell transistors, the programmed memory cell transistors may be turned on by applying the read voltage $V_{READ}$ to the word lines connected to the programmed memory cell transistors. A bit line voltage of about 0.4V to about 0.9V may be applied to selected bit lines BL connected to the cell strings CSTR including the selected memory cell transistors MCT. The other bit lines BL, that is, the non selected bit lines BL may be grounded, and the common source lines CSL may also be grounded. The read voltage $V_{READ}$ may be applied to the ground selection lines GSL to turn on the ground selection transistors GST. Thus, the channel regions of the selected memory cell transistors MCT may be electrically connected to the common source lines CSL. Moreover, the read voltage $V_{READ}$ may be applied to the selected string selection lines SSL connected to the selected cell strings CSTR including the selected memory cell transistors MCT, and a ground voltage may be applied to the other string selection lines SSL.

Under the read bias condition described above, each of the selected memory cell transistors MCT may be turned on or off according to the data (a logic "0" data or a logic "1" data) stored therein. For example, if the selected memory cell transistor is turned on, a relatively large cell current may flow through the selected cell string CSTR including the selected memory cell transistor MCT which is turned on. In contrast, if the selected memory cell transistor is turned off, a relatively small cell current (corresponding to a leakage current) may flow through the selected cell string CSTR including the selected memory cell transistor MCT, which is turned off. Thus, the data stored in the selected memory cell transistor MCT can be discriminated by detecting the cell current flowing through the bit line BL connected to the selected cell string CSTR.

Finally, an erasure operation for removing the data stored in the memory cell transistors MCT will be described. In an embodiment, the erasure operation may be achieved by injecting electric charges stored in gate patterns or gate dielectric layers of the memory cell transistors MCT into the vertical active patterns. Alternatively, the erasure operation may be achieved by injecting opposite type of electrical charges to the electric charges stored in the gate patterns or the gate dielectric layers of the memory cell transistors MCT into the gate patterns or the gate dielectric layers of the memory cell transistors MCT. Meanwhile, the erasure operation may be performed by the single memory cell transistor or by the memory cell block of the cell array.

Figure 2A:
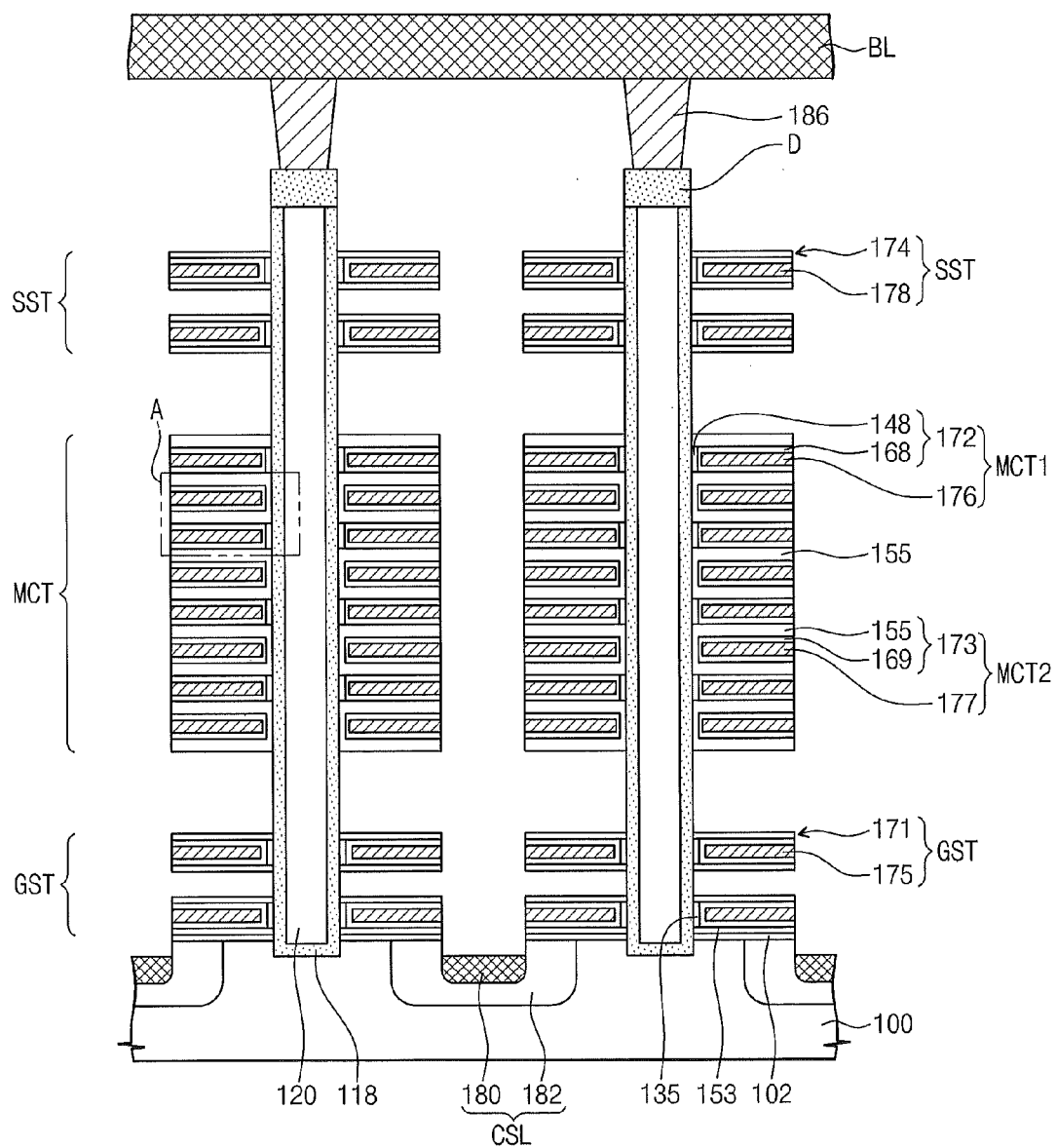
FIG. 2A is a cross sectional view illustrating a portion of a three-dimensional semiconductor memory device according to an embodiment.
Figure 2B:
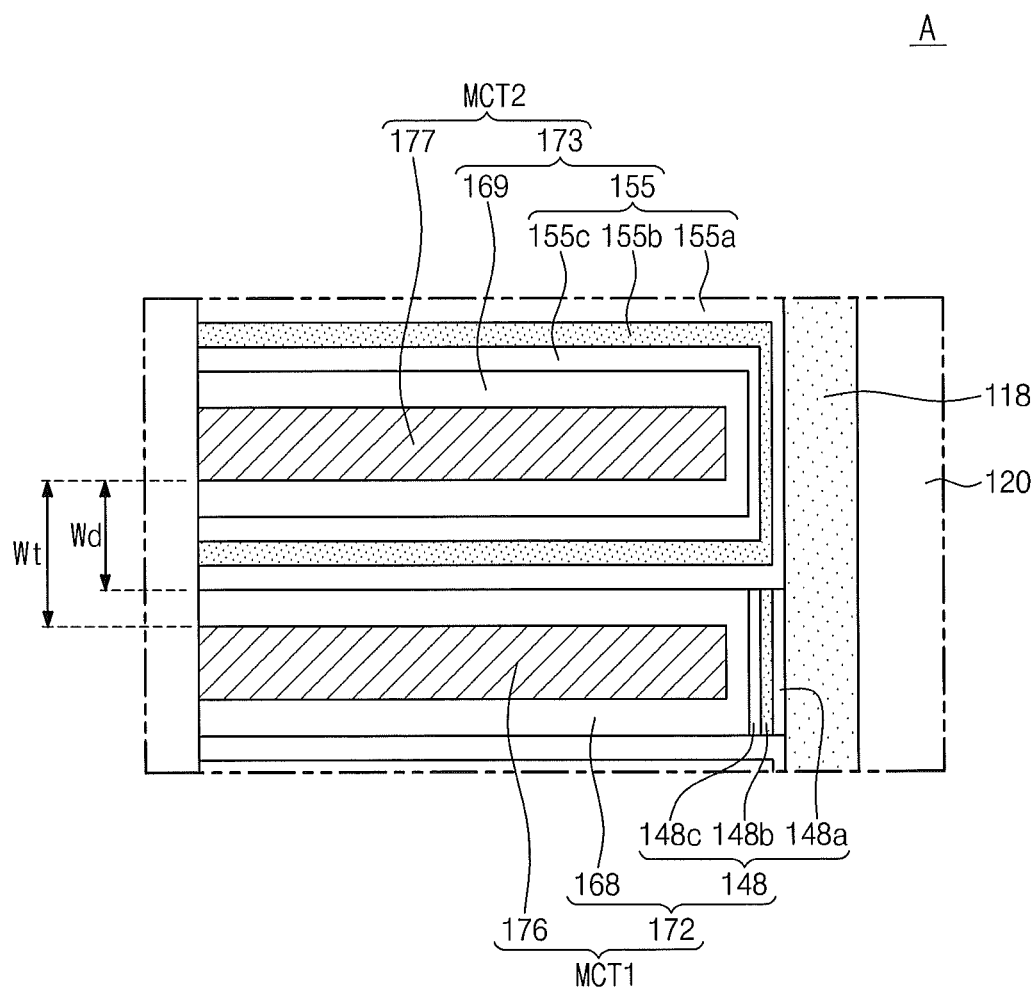
FIG. 2B is an enlarged view illustrating a portion A of FIG. 2A.

FIG. 2A is a cross sectional view illustrating a portion of a three-dimensional semiconductor memory device according to an embodiment, and FIG. 2B is an enlarged view illustrating a portion A of FIG. 2A. Referring to FIGS. 2A and 2B, a three-dimensional semiconductor memory device according to an embodiment may include common source lines CSL, vertical active patterns 118, ground selection transistors GST, the memory cell transistors MCT, the string selection transistors SST and the bit line BL. The common source lines CSL may be disposed in a substrate 100. The substrate 100 may be a silicon substrate, a germanium substrate or a silicon-germanium substrate. In an embodiment, the common source lines CSL may correspond to impurity regions. The common source lines CSL may extend in a first direction. In addition, each of the common source lines CSL may include an impurity region 182 and a metal silicide layer 180 formed on the impurity region 182.

The vertical active patterns 118 may extend in a vertical direction from a top surface of the substrate 100. In an embodiment, each of the vertical active patterns 118 may have a cylindrical shape with an empty space therein and may have a closed bottom portion. The empty spaces in the vertical active patterns 118 may be filled with buried insulation patterns 120. The ground selection transistors GST, the memory cell transistors MCT and the string selection transistors SST may be sequentially stacked. The ground selection transistors GST may be disposed to be adjacent to the substrate 100, and the string selection transistors SST may be disposed to be adjacent to the bit lines BL. The memory cell transistors MCT may be disposed between the ground selection transistors GST and the string selection transistors SST. In an embodiment, a buffer insulation layer 102 may be additionally disposed between the ground selection transistors GST and the substrate 100. Each of the ground selection transistors GST may include a conductive pattern 175 and a dielectric pattern 171 disposed between the vertical active pattern 118 and the conductive pattern 175. The dielectric pattern 171 of each of the ground selection transistors GST may have a multi-layered structure. For example, the dielectric pattern 171 may have a structure including an oxide layer, a nitride layer and an oxide layer which are stacked.

Some of the memory cell transistors MCT in one of the cell strings (refer to "CSTR" of FIG. 1) may be vertically stacked. Each of the memory cell transistors MCT may include a gate pattern 176 or 177 and a dielectric pattern 172 or 173. Detailed descriptions to the memory cell transistors MCT will be mentioned later. Each of the string selection transistors SST may include a conductive pattern 178 and a dielectric pattern 174 disposed between the vertical active pattern 118 and the conductive pattern 178. The dielectric pattern 174 of each of the string selection transistors SST may have a multi-layered structure. For example, the dielectric pattern 174 may have a structure including an oxide layer, a nitride layer and an oxide layer which are stacked.

The three-dimensional semiconductor memory device according to the present embodiment may further include impurity regions D (e.g., drain regions) disposed in respective ones of upper portions of the vertical active patterns 118. The bit line BL may be electrically connected to the impurity regions D. For example, the bit lines BL may be electrically connected to the impurity regions D through contact plugs 186. The bit lines BL may extend in a second direction perpendicular to the first direction. The first and second directions may be parallel with the top surface of the substrate 100.

Hereinafter, the memory cell transistors MCT of the three-dimensional semiconductor memory device according to the present embodiment will be described in detail. The memory cell transistors MCT in each of the cell strings CSTR may include first gate patterns 176 and second gate patterns 177 which are alternately stacked. For the purpose of ease and convenience in explanation, the memory cell transistors MCT including the first gate patterns 176 are referred to as first memory cell transistors MCT1 and the memory cell transistors MCT including the second gate patterns 177 are referred to as second memory cell transistors MCT2. In each of the cell strings CSTR, the first memory cell transistors MCT1 and the second memory cell transistors MCT2 may be alternately stacked and may be disposed to be adjacent to a sidewall of one of the vertical active patterns 118.

Referring to FIG. 2B, each of the first memory cell transistors MCT1 may include the first gate pattern 176 and the first dielectric pattern 172 disposed between the first gate pattern 176 and the vertical active pattern 118 adjacent thereto. The first dielectric pattern 172 may include a first tunnel insulation layer 148a, a first charge storage layer 148b and a first barrier dielectric layer 148c. In an embodiment, the first tunnel insulation layer 148a may be disposed to be adjacent to the vertical active pattern 118, and the first barrier dielectric layer 148c may be disposed to be adjacent to the first gate pattern 176. The first charge storage layer 148b may be disposed between the first tunnel insulation layer 148a and the first barrier dielectric layer 148c. In an embodiment, the first dielectric pattern 172 may further include a first metal oxide layer 168 disposed between the first gate pattern 176 and the first barrier dielectric layer 148c. The first metal oxide layer 168 may extend to cover a top surface and a bottom surface of the first gate pattern 176. The first barrier dielectric layer 148c may be a material having an energy band gap which is greater than that of the first metal oxide layer 168, and the first metal oxide layer 168 may be a high-k dielectric layer having a dielectric constant which is greater than that of the first tunnel insulation layer 148a.

Each of the second memory cell transistors MCT2 may include the second gate pattern 177 and the second dielectric pattern 173 disposed between the second gate pattern 177 and the vertical active pattern 118 adjacent thereto. The second dielectric pattern 173 may include a first portion disposed between the second gate pattern 177 and the vertical active pattern 118 and a second portion extending to cover a top surface and a bottom surface of the second gate pattern 177. The second dielectric pattern 173 may include a second tunnel insulation layer 155a, a second charge storage layer 155b and a second barrier dielectric layer 155c. In an embodiment, the second tunnel insulation layer 155a may be disposed to be adjacent to the vertical active pattern 118, and the second barrier dielectric layer 155c may be disposed to be adjacent to the second gate pattern 177. The second charge storage layer 155b may be disposed between the second tunnel insulation layer 155a and the second barrier dielectric layer 155c. In an embodiment, the second dielectric pattern 173 may further include a second metal oxide layer 169 disposed between the second gate pattern 177 and the second barrier dielectric layer 155c. The second barrier dielectric layer 155c may be a material having an energy band gap which is greater than that of the second metal oxide layer 169, and the second metal oxide layer 169 may be a high-k dielectric layer having a dielectric constant which is greater than that of the second tunnel insulation layer 155a.

According to the above descriptions, the first and second gate patterns 176 and 177, which are vertically stacked, may be spaced apart from each other by the second portions of the second dielectric patterns 173. In an embodiment, a distance Wt between the first and second gate patterns 176 and 177 vertically stacked may be substantially equal to a vertical thickness Wd of each of the second portions of the second dielectric patterns 173. Alternatively, the distance Wt between the first and second gate patterns 176 and 177 vertically stacked may be substantially less than twice the vertical thickness Wd of each of the second portions of the second dielectric patterns 173.

According to the above embodiment, an additional insulation layer other than the first and/or second gate patterns 176 and 177 are not required to separate and properly insulate the first and second gate patterns 176 and 177 from each other. That is, the first and second gate patterns 176 and 177 can be separated and insulated from each other by only the first and/or second gate patterns 176 and 177, thereby minimizing the distance Wt between the first and second gate patterns 176 and 177. Thus, the integration density, particularly, the vertical integration density of the three-dimensional semiconductor memory device can be increased.

Figure 3A:
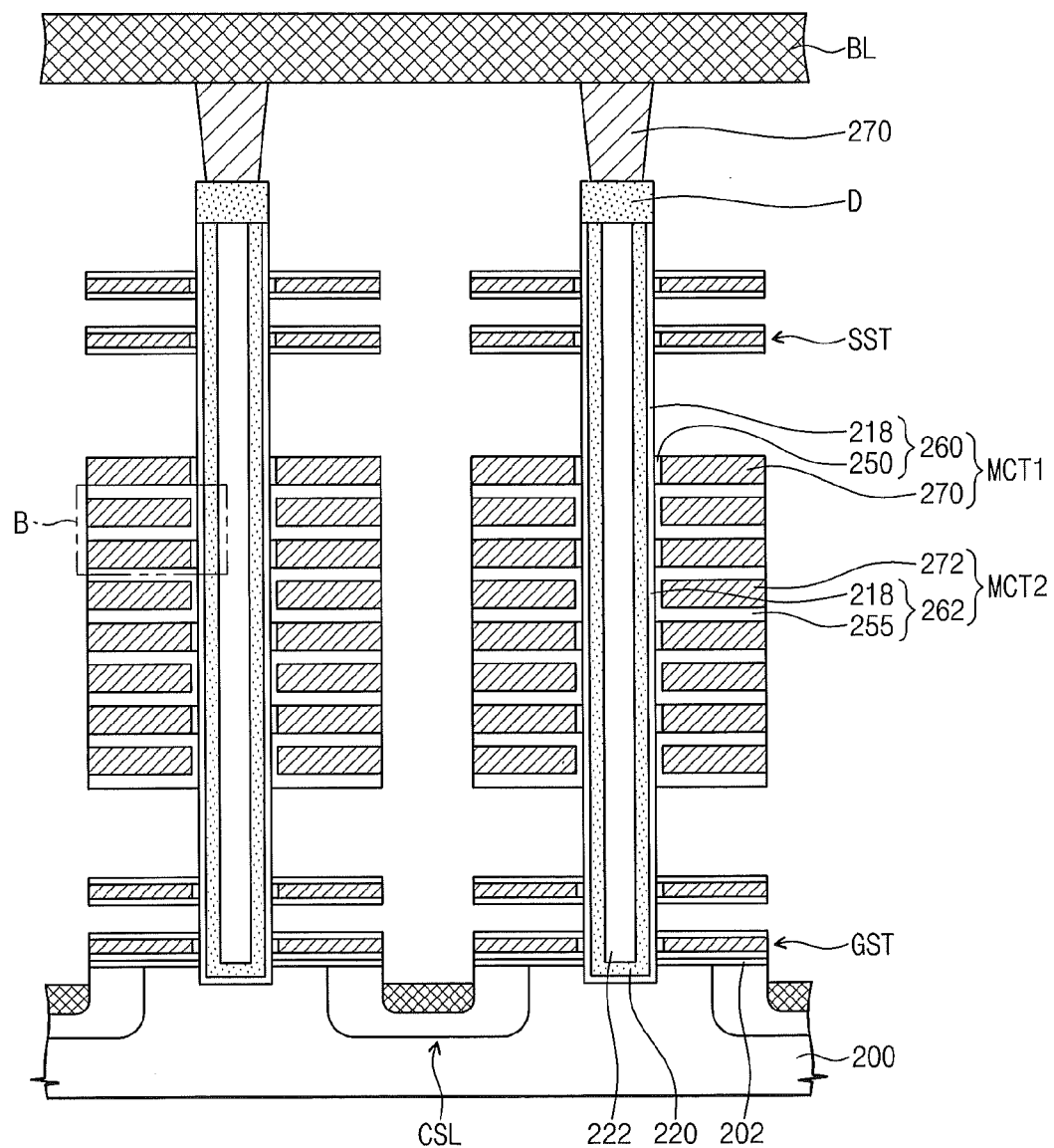
FIG. 3A is a cross sectional view illustrating a portion of a three-dimensional semiconductor memory device according to another embodiment.
Figure 3B:
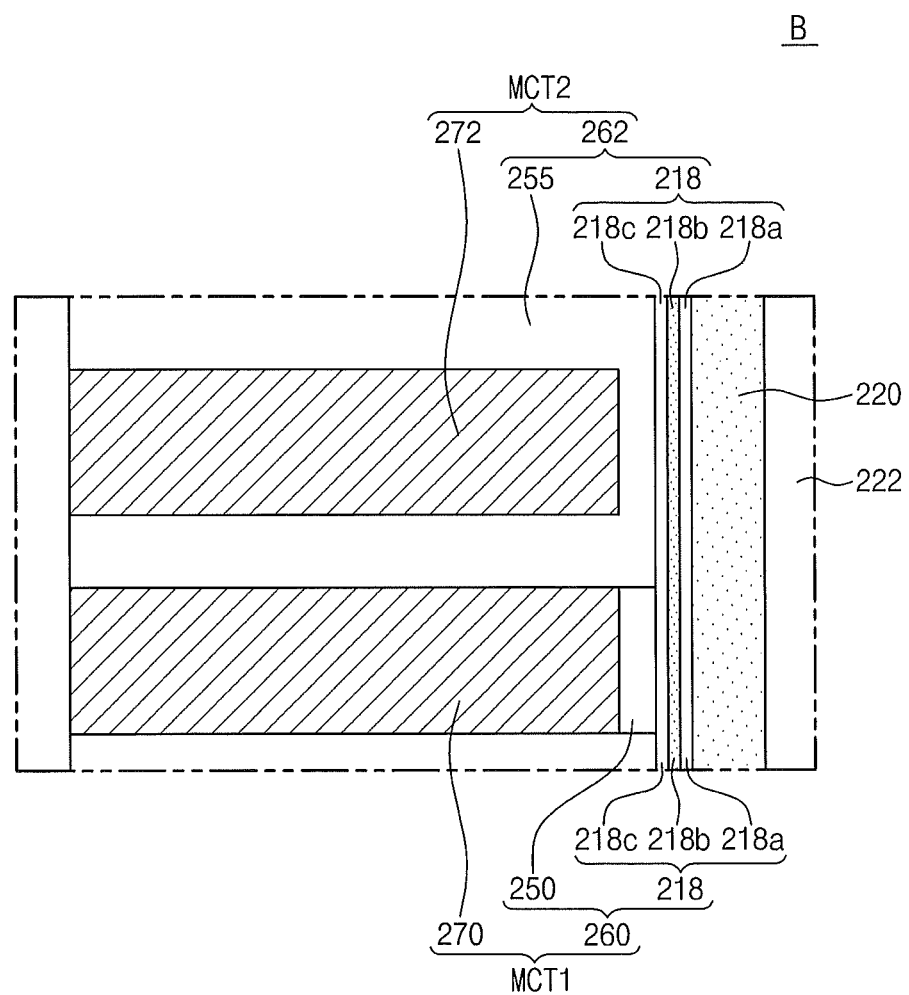
FIG. 3B is an enlarged view illustrating a portion B of FIG. 3A.

FIG. 3A is a cross sectional view illustrating a portion of a three-dimensional semiconductor memory device according to another embodiment, and FIG. 3B is an enlarged view illustrating a portion B of FIG. 3A. Referring to FIGS. 3A and 3B, a three-dimensional semiconductor memory device according to the present embodiment may include common source lines CSL, vertical active patterns 220, ground selection transistors GST, the memory cell transistors MCT, the string selection transistors SST and the bit line BL. The three-dimensional semiconductor memory device may further include a buffer layer 202 and drain regions D. The memory cell transistors MCT may include first memory cell transistors MCT1 and second memory cell transistors MCT2. In each cell string, the first memory cell transistors MCT1 and the second memory cell transistors MCT2 may be alternately stacked and may be disposed to be adjacent to a sidewall of one of the vertical active patterns 220.

Each of the first memory cell transistors MCT1 may include a first gate pattern 270 and a first dielectric pattern 260 disposed between the first gate pattern 270 and the vertical active pattern 220 adjacent thereto. The first dielectric pattern 260 may include a common tunnel insulation layer 218a, a common charge storage layer 218b, a common barrier dielectric layer 218c and a first metal oxide layer 250. The common tunnel insulation layer 218a, the common charge storage layer 218b and the common barrier dielectric layer 218c may be disposed to extend along an outer sidewall of the vertical active pattern 220. In an embodiment, the first metal oxide layer 250 may be disposed between the common barrier dielectric layer 218c and the first gate pattern 270.

Each of the second memory cell transistors MCT2 may include a second gate pattern 272 and a second dielectric pattern 262 disposed between the second gate pattern 272 and the vertical active pattern 220 adjacent thereto. The second dielectric pattern 262 may include the common tunnel insulation layer 218a, the common charge storage layer 218b, the common barrier dielectric layer 218c and a second metal oxide layer 255. In an embodiment, the second metal oxide layer 255 may be disposed between the common barrier dielectric layer 218c and the second gate pattern 272, and may extend to cover a top surface and a second surface of the second gate pattern 272.

According to the above descriptions, the first and second gate patterns 270 and 272, which are vertically stacked, may be spaced apart from each other by the second metal oxide layer 255. In an embodiment, a distance between the first and second gate patterns 270 and 272 vertically stacked may be substantially equal to a vertical thickness of the second metal oxide layer 255. According to the above embodiment, an additional insulation layer other than the second metal oxide layer 255 is not required in order to adequately separate and insulate the first and second gate patterns 270 and 272 from each other. That is, the first and second gate patterns 270 and 272 can be separated and insulated from each other by only the second metal oxide layer 255, thereby minimizing the distance between the first and second gate patterns 270 and 272 and increasing vertical integration density.

The common source lines CSL, the vertical active patterns 220, the ground selection transistors GST, the string selection transistors SST, the bit line BL, the buffer layer 202 and the drain regions D illustrated in FIGS. 3A and 3B may have the same configurations as the common source lines CSL, the vertical active patterns 118, the ground selection transistors GST, the string selection transistors SST, the bit line BL, the buffer layer 102 and the drain regions D illustrated in FIGS. 2A and 2B, respectively. Thus, the detailed descriptions to the common source lines CSL, the vertical active patterns 220, the ground selection transistors GST, the string selection transistors SST, the bit line BL, the buffer layer 202 and the drain regions D illustrated in FIGS. 3A and 3B are omitted in the present embodiment.

Figure 4A:
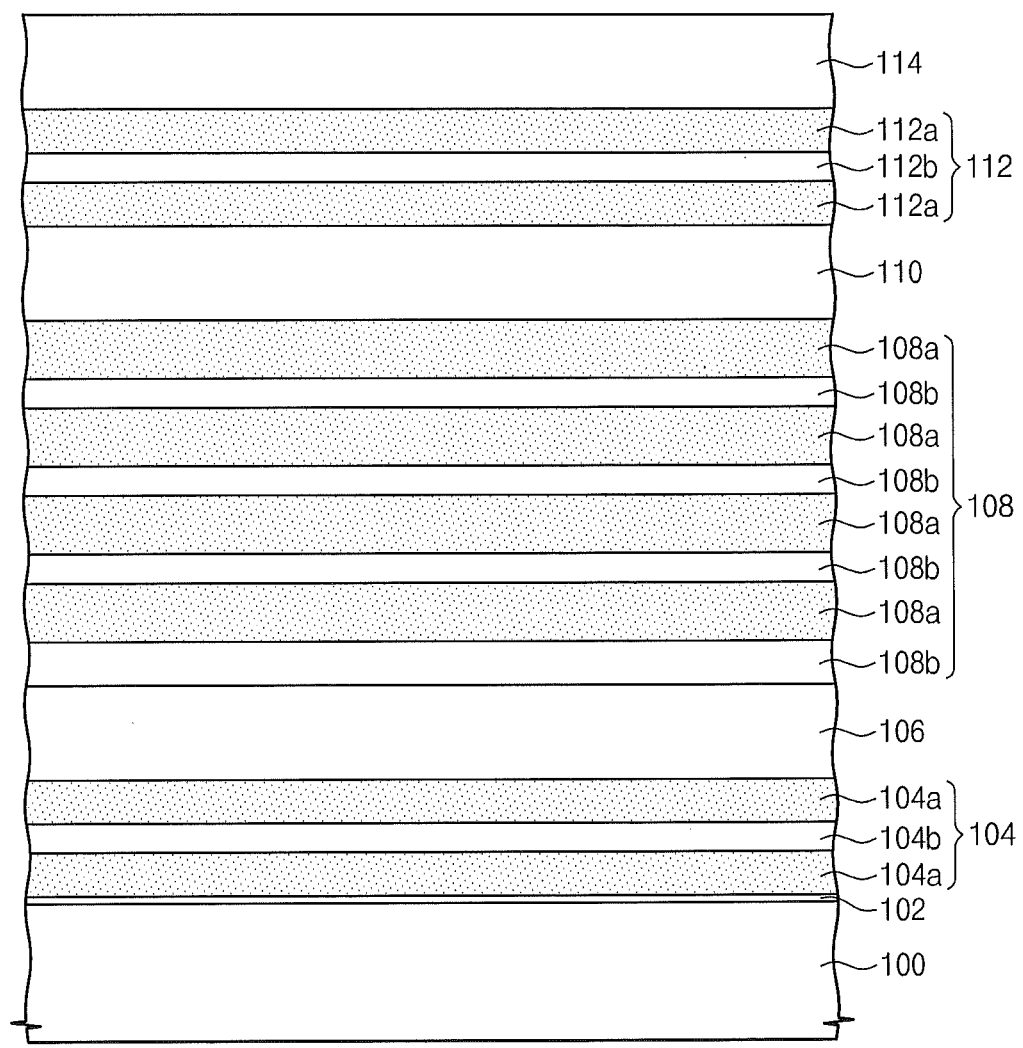
FIGS. 4A through 4O are cross sectional views illustrating a method of manufacturing a three-dimensional semiconductor memory device according to an embodiment.

FIGS. 4A through 4O are cross sectional views illustrating a method of manufacturing a three-dimensional semiconductor memory device according to an embodiment. Referring to FIG. 4A, a buffer insulation layer 102, a first film structure 104, a second film structure 108, a third film structure 112, a first interlayer insulation layer 106, a second interlayer insulation layer 110 and a third interlayer insulation layer 114 may be stacked on a substrate 100. More specifically, the buffer insulation layer 102 may be formed by thermally oxidizing the substrate 100 or by a chemical vapor deposition (CVD) process. The buffer insulation layer may be formed to include a silicon oxide layer. The first film structure 104 may be formed by sequentially stacking a first layer 104a, a second layer 104b and a first layer 104a. The first layers 104a may include a material having an etch selectivity with respect to the second layer 104b in a predetermined etchant.

The second film structure 108 may be formed by alternately stacking third layers 108a and fourth layers 108b. The number of the third layers 108a and the number of the fourth layers 108b may depend on the number of memory cell transistors constituting a single vertical cell string. Each of the third layers 108a may be formed to include a material having an etch selectivity with respect to the fourth layers 108b in a predetermined etchant. The third film structure 112 may be formed by sequentially stacking a fifth layer 112a, sixth layer 112b and a fifth layer 112a. The fifth layers 112a may include a material having an etch selectivity with respect to the sixth layer 112b in a predetermined etchant. According to some embodiments, the second, fourth and sixth layers 104b, 108b and 112b may include a material having substantially the same etch rate in a predetermined etchant. That is, the second, fourth and sixth layers 104b, 108b and 112b may include the same material, for example, a nitride layer such as a silicon nitride layer.

The first interlayer insulation layer 106 may be formed between the first film structure 104 and the second film structure 108, and the second interlayer insulation layer 110 may be formed between the second film structure 108 and the third film structure 112. The third interlayer insulation layer 114 may be formed on the third film structure 112. The first, second and third interlayer insulation layers 106, 110 and 114 may include a material having an etch selectivity with respect to the first, second and third film structures 104, 108 and 112 in a predetermined etchant.

Figure 4B:
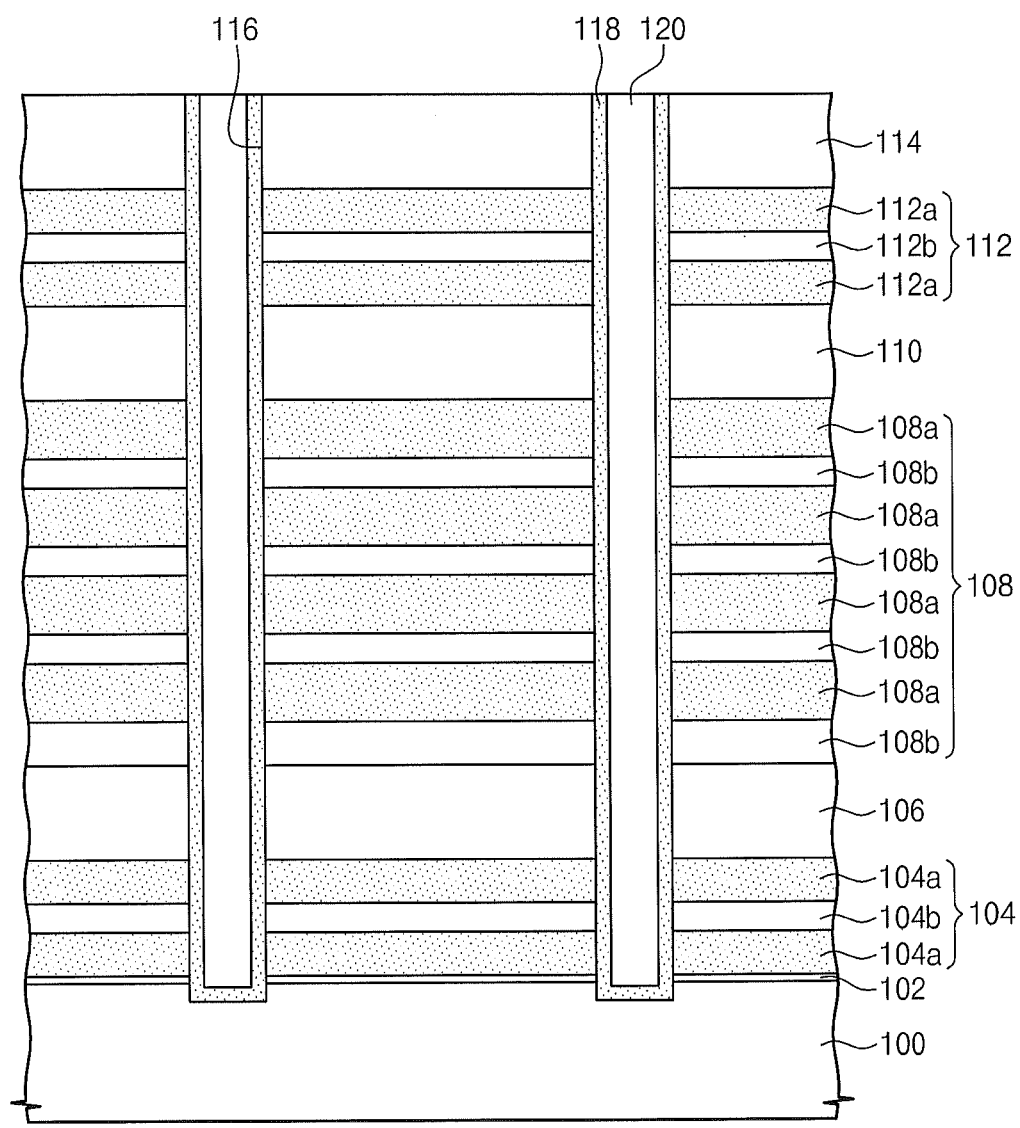

Referring to FIG. 4B, vertical active patterns 118 and buried insulation patterns 120 may be formed to penetrate the buffer insulation layer 102, the first to third film structures 104, 108 and 112, and the first to third interlayer insulation layers 106, 110 and 114. In an embodiment, the first to third interlayer insulation layers 106, 110 and 114, the first to third film structures 104, 108 and 112, and the buffer insulation layer 102 may be etched to form through holes 116 exposing portions of the substrate 100. During formation of the through holes 116, the substrate 100 may be over-etched and may be recessed. A first conductive layer (not shown) may be conformally formed on the substrate including the through holes 116. That is, the first conductive layer may be conformally formed along inner surfaces of the through holes 116. Thus, the first conductive layer may partially fill the through holes 116. A buried insulation layer (not shown) may be formed on the first conductive layer. The buried insulation layer may be formed to completely fill the through holes 116.

The buried insulation layer and the first conductive layer may be planarized to expose a top surface of the third interlayer insulation layer 114 and to concurrently form the vertical active pattern 118 and the buried insulation pattern 120 in each of the through holes 116. The vertical active pattern 118 may have a cylindrical shape with an empty space therein and may have a closed bottom portion. The empty spaces in the vertical active patterns 118 may be filled with the buried insulation patterns 120. However, the configuration of the vertical active patterns 118 may be not limited to the above descriptions.

Figure 4C:
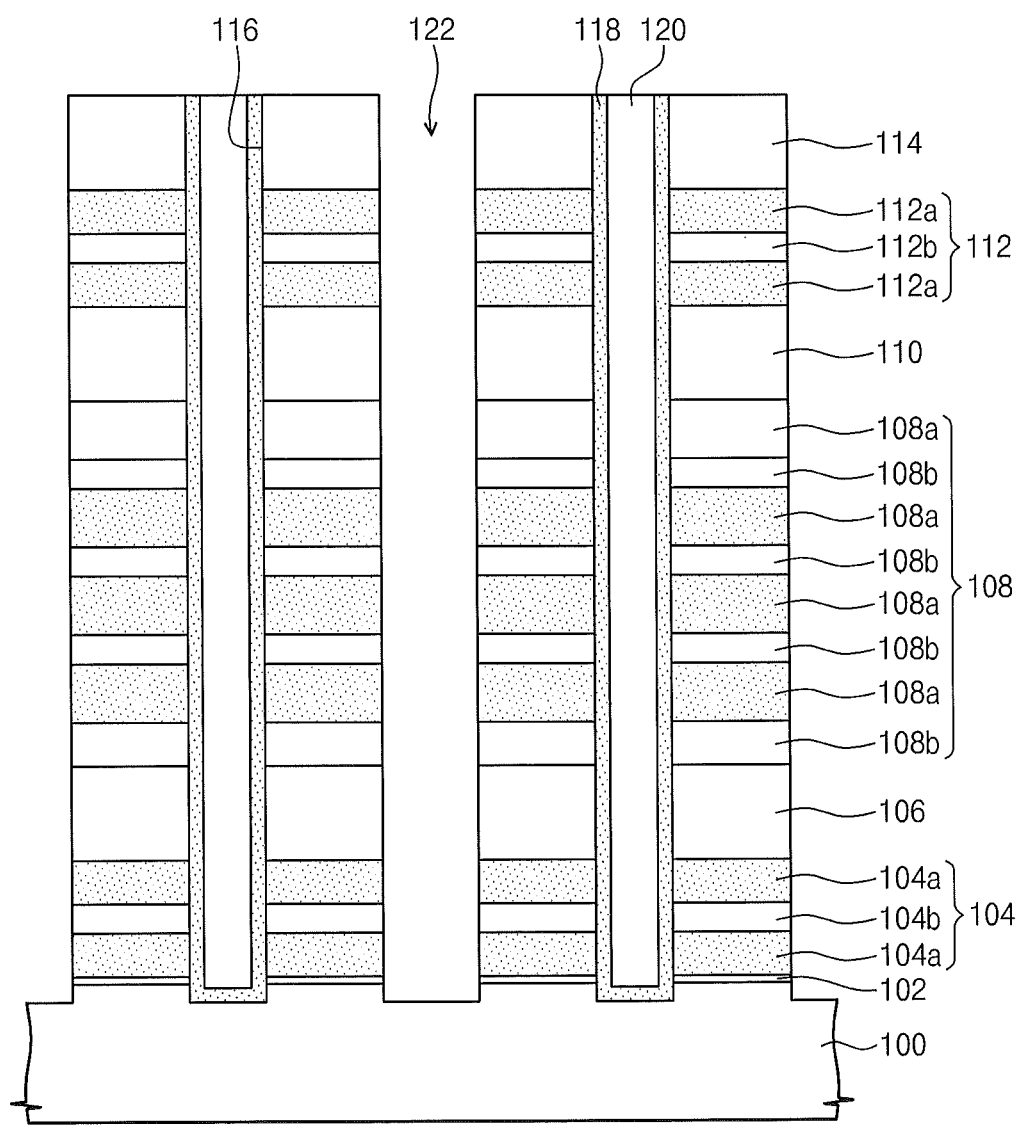

Referring to FIG. 4C, the first to third interlayer insulation layers 106, 110 and 114, the first to third film structures 104, 108 and 112, and the buffer insulation layer 102 may be etched to form a trench 122 exposing the substrate 100 and extending in a direction. During formation of the trench 122, the substrate 100 may also over-etched and may be recessed. The trench 122 may also expose the first, third and fifth layers 104a, 108a and 112a.

Figure 4D:
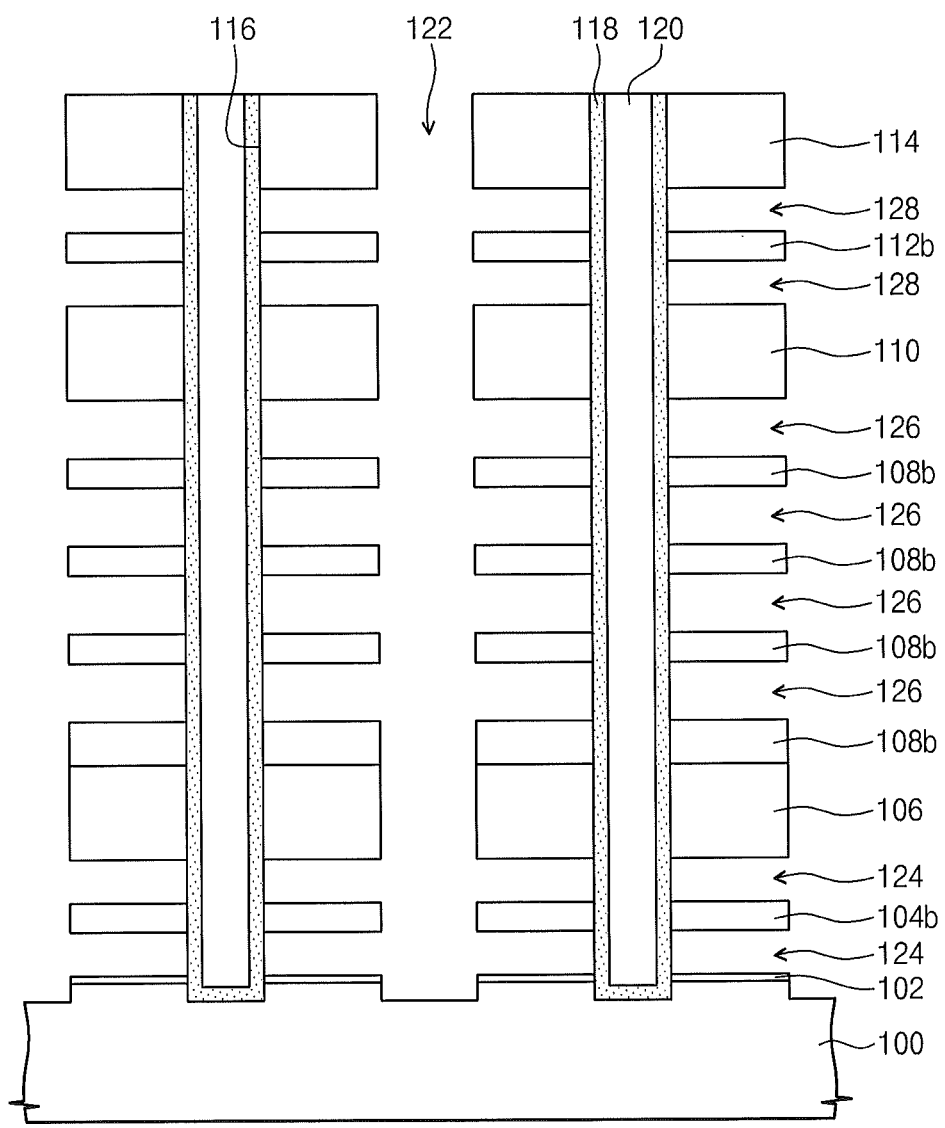

Referring to FIG. 4D, the first, third and fifth layers 104a, 108a and 112a exposed by the trench 122 may be removed to form first recessed regions 124, second recessed regions 126 and third recessed regions 128. According to some embodiments, the first recessed regions 124 may correspond to spaces to be filled with gate patterns of ground selection transistors in a subsequent process, and the second recessed regions 126 may correspond to spaces to be filled with gate patterns of memory cell transistors in a subsequent process. Furthermore, the third recessed regions 128 may correspond to spaces to be filled with gate patterns of string selection transistors in a subsequent process.

Figure 4E:
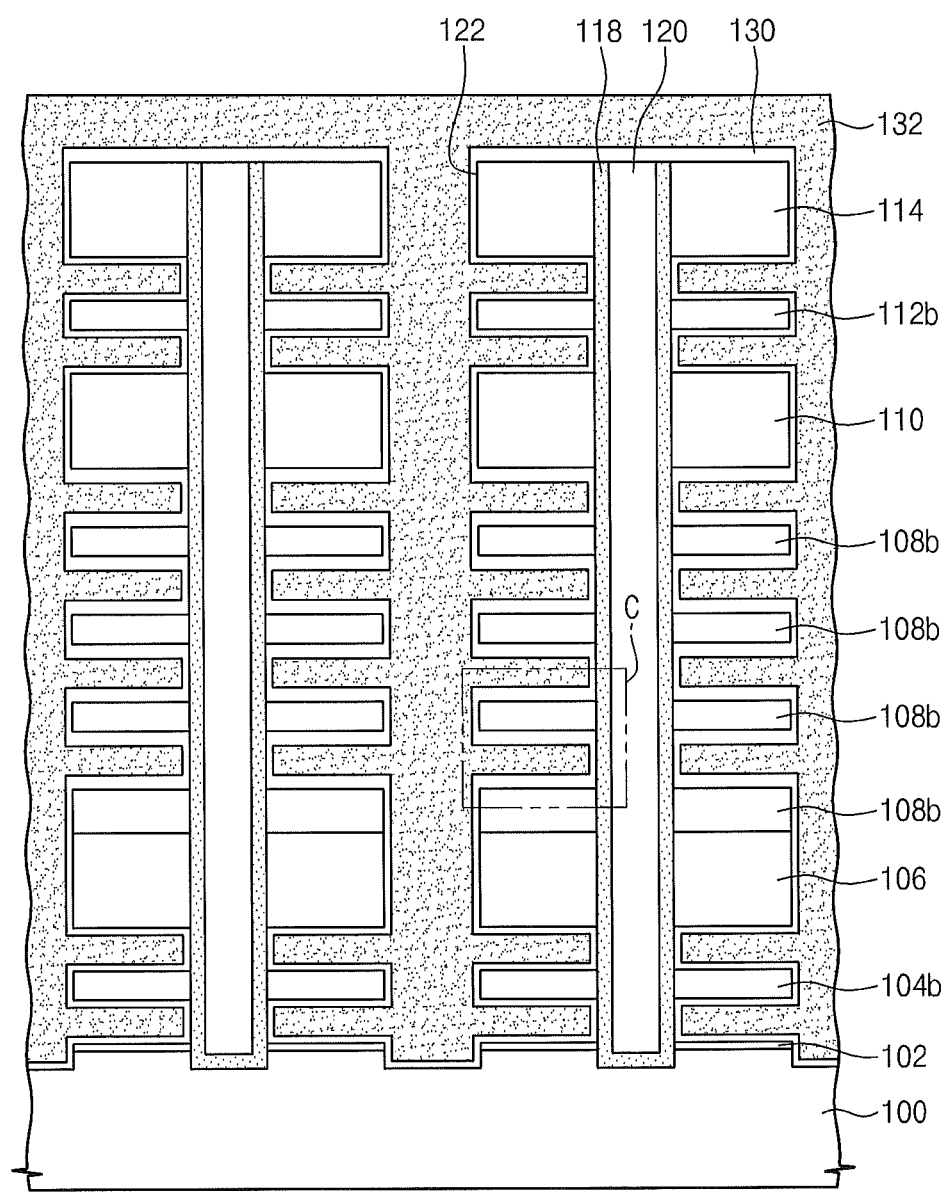

Referring to FIG. 4E, a first dielectric layer 130 and a first material layer 132 may be formed on the substrate including the trench 122 and the first to third recessed regions 124, 126 and 128. The first dielectric layer 130 may be conformally formed on the substrate, and the first material layer 132 may be formed on the first dielectric layer 130 to fill the trench 122 and the first to third recessed regions 124, 126 and 128.

In an embodiment, a thickness of the first dielectric layer 130 formed on sidewalls of the vertical active patterns 118 may be substantially different from a thickness of the first dielectric layer 130 formed on top surfaces and bottom surfaces of the second, fourth and sixth layers 104b, 108b and 112b. For example, the thickness of the first dielectric layer 130 formed on sidewalls of the vertical active patterns 118 may be substantially less than the thickness of the first dielectric layer 130 formed on the top surfaces and the bottom surfaces of the second, fourth and sixth layers 104b, 108b and 112b. Alternatively, the thickness of the first dielectric layer 130 formed on sidewalls of the vertical active patterns 118 may be substantially equal to the thickness of the first dielectric layer 130 formed on the top surfaces and the bottom surfaces of the second, fourth and sixth layers 104b, 108b and 112b.

Figure 4F:
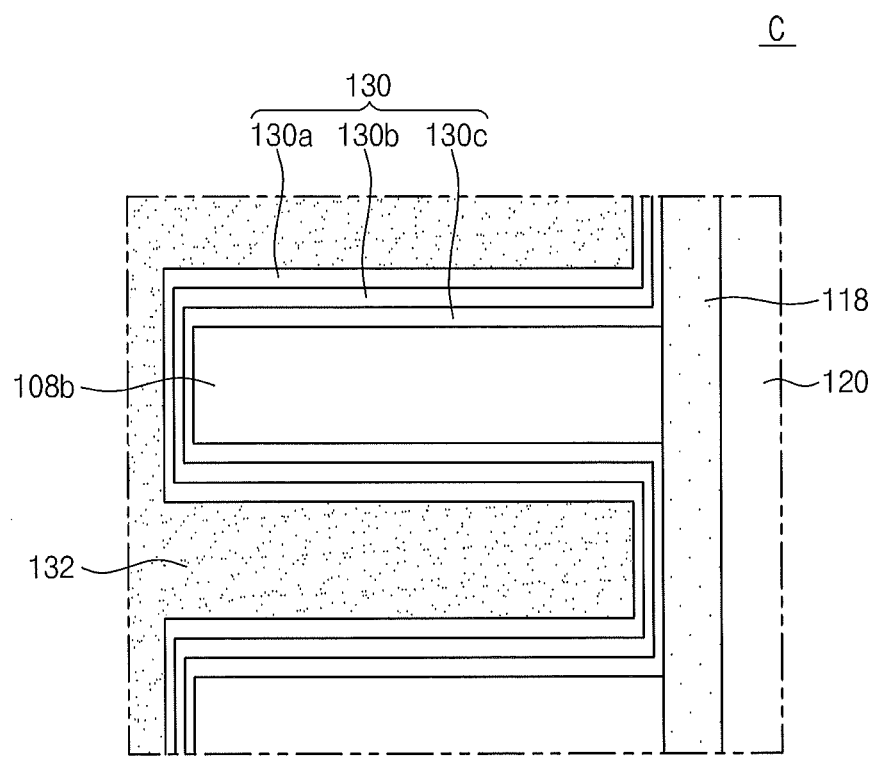

FIG. 4F is an enlarged view illustrating a portion 'C' of FIG. 4E. Referring to FIGS. 4E and 4F, the first dielectric layer 130 may be formed by sequentially stacking a first tunnel insulation layer 130a, a first charge storage layer 130b and a first barrier dielectric layer 130c. For example, the first tunnel insulation layer 130a may be formed to include an oxide layer such as a silicon oxide layer, and the first charge storage layer 130b may be formed to include a nitride layer such as a silicon nitride layer. Further, the first barrier dielectric layer 130c may be formed to include an oxide layer such as a silicon oxide layer.

The first material layer 132 may be formed to include an undoped silicon layer, a doped silicon layer, a metal layer or a metal compound layer. However, in the exemplary embodiments, any materials having an etch selectivity with respect to the second, fourth and sixth layers 104b, 108b and 112b and the first to third interlayer insulation layers 106, 110 and 114 in a predetermined etchant can be used as the first material layer 132.

Figure 4G:
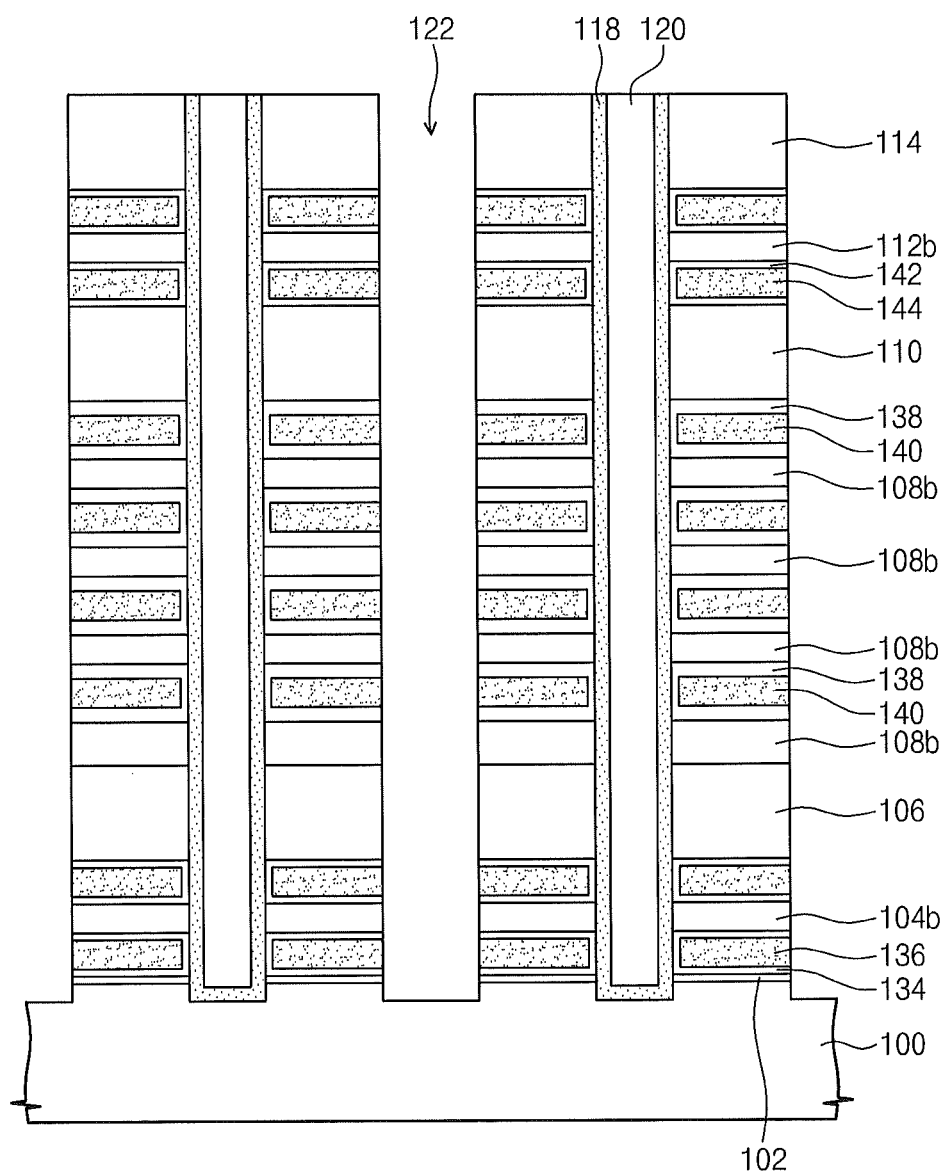

Referring to FIG. 4G, the first material layer 132 and the first dielectric layer 130 may be etched using the third interlayer insulation layer 114 as an etch stop later, thereby exposing sidewalls of the first to third interlayer insulation layers 106, 110 and 114 and sidewalls of the second, fourth and sixth layers 104b, 108b and 112b. As a result, a first preliminary dielectric pattern 134 and a first material pattern 136 may be formed in each of the first recessed regions 124, and a second preliminary dielectric pattern 138 and a second material pattern 140 may be formed in each of the second recessed regions 126. In addition, a third preliminary dielectric pattern 142 and a third material pattern 144 may be formed in each of the third recessed regions 128. Moreover, while the first to third preliminary dielectric patterns 134, 138 and 142 and the first to third material patterns 136, 140 and 144 are formed, the first material layer 132 and the first dielectric layer 130 in the trench 122 may be removed to expose the substrate 100 under the trench 122.

Figure 4H:
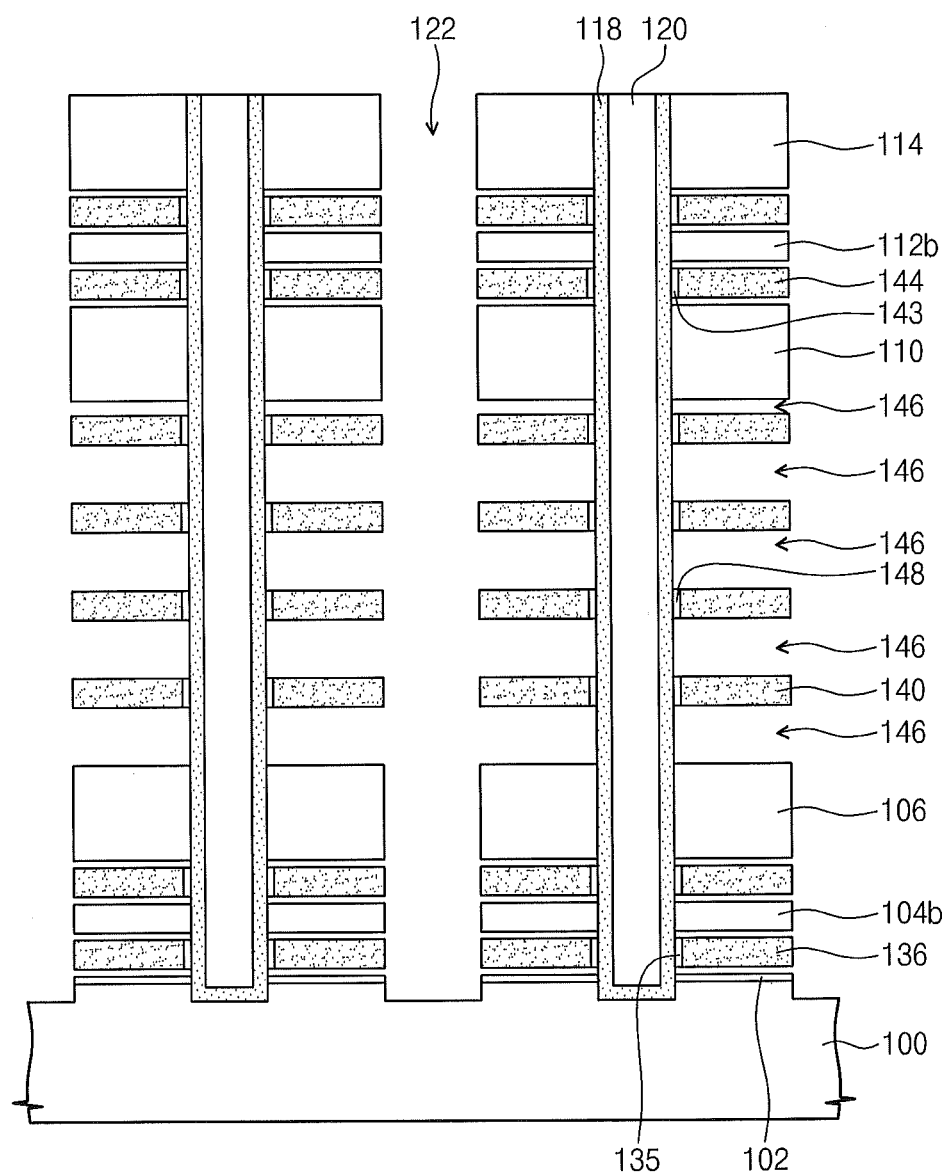

Referring to FIG. 4H, the fourth layers 108b may be removed to form fourth recessed regions 146. In an embodiment, the second and sixth layers 104b and 112b may include a different material from the fourth layers 108b. Thus, during removal of the fourth layers 108b, the second and sixth layers 104b and 112b may still remain. In an embodiment, if the fourth layers 108b include a silicon oxide layer, portions of the first to third preliminary dielectric patterns 134, 138 and 142 covering the top and bottom surfaces of the first to third material patterns 136, 140 and 144 may be partially etched while the fourth layers 108b are removed. The fourth layers 108b may be removed using an etching process that employs a phosphoric acid ($H_3PO_4$) solution, a hydrofluoric acid (HF) solution or a buffed oxide etchant (BOE) as an etchant. After the first to third preliminary dielectric patterns 134, 138 and 142 are partially etched, first, second and third dielectric patterns 135, 148 and 143 may be formed between the vertical active patterns 118 and the first to third material patterns 136, 140 and 144. That is, top and bottom surfaces of the first and third material patterns 136 and 144 may be exposed to form spaces on the top and bottom surfaces of the first and third material patterns 136 and 144.

Figure 4I:
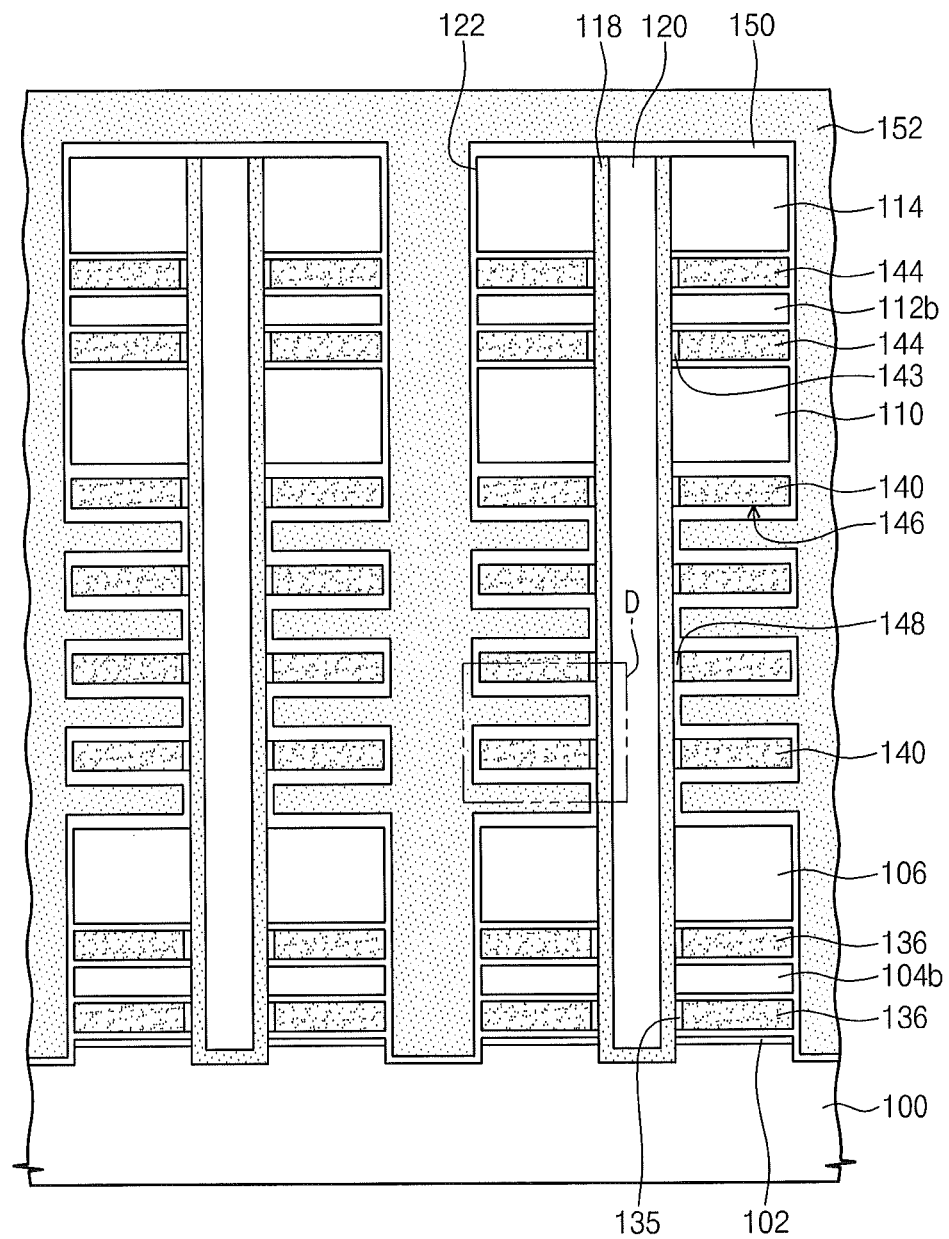

Referring to FIG. 4I, a second dielectric layer 150 and a second material layer 152 may be formed on the substrate including the fourth recessed regions 146. The second dielectric layer 150 may be conformally formed on the substrate, and the second material layer 152 may be formed on the second dielectric layer 150 to fill the trench 122 and the fourth recessed regions 146. The second dielectric layer 152 may be formed to fill the spaces on the top and bottom surfaces of the first and third material patterns 136 and 144. In an embodiment, a thickness of the second dielectric layer 150 formed on sidewalls of the vertical active patterns 118 may be substantially different from a thickness of the second dielectric layer 150 formed on top surfaces and bottom surfaces of the second material patterns 140. For example, the thickness of the second dielectric layer 150 formed on the sidewalls of the vertical active patterns 118 may be substantially less than the thickness of the second dielectric layer 150 formed on the top surfaces and the bottom surfaces of the second material patterns 140. Alternatively, the thickness of the second dielectric layer 150 formed on the sidewalls of the vertical active patterns 118 may be substantially equal to the thickness of the second dielectric layer 150 formed on the top surfaces and the bottom surfaces of the second material patterns 140.

Figure 4J:
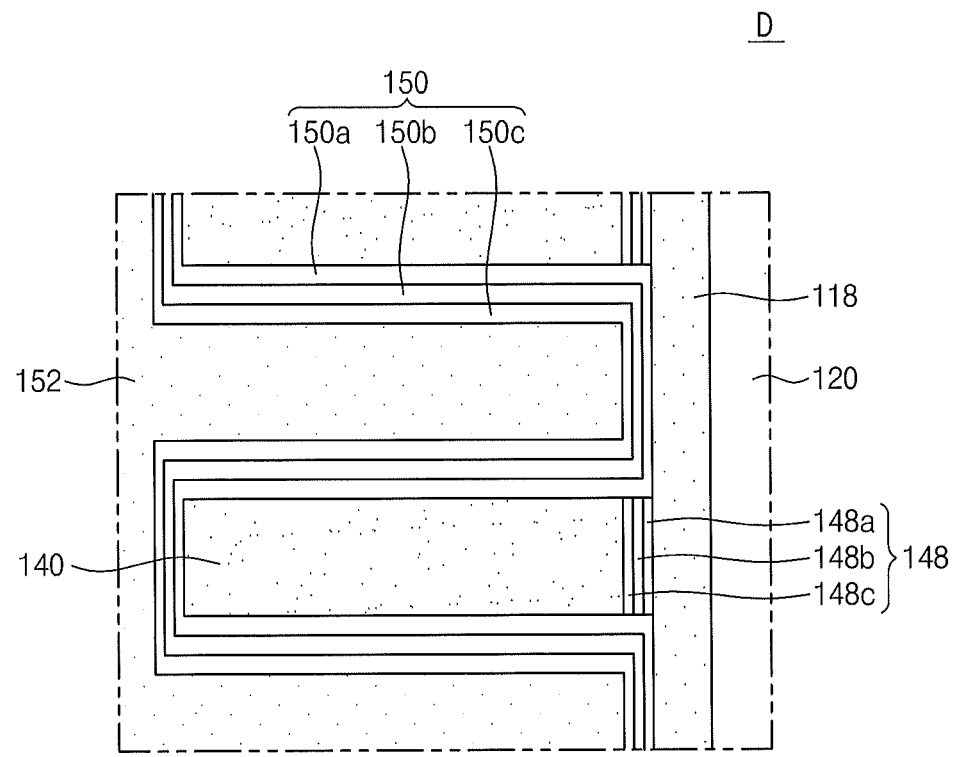

FIG. 4J is an enlarged view illustrating a portion 'D' of FIG. 4I. Referring to FIGS. 4I and 4J, the second dielectric layer 150 may be formed by sequentially stacking a second tunnel insulation layer 150a, a second charge storage layer 150b and a second barrier dielectric layer 150c. For example, the second tunnel insulation layer 150a may be formed to include an oxide layer such as a silicon oxide layer, and the second charge storage layer 150b may be formed to include a nitride layer such as a silicon nitride layer. Further, the second barrier dielectric layer 150c may be formed to include an oxide layer such as a silicon oxide layer.

The second material layer 152 may be formed to include an undoped silicon layer, a doped silicon layer, a metal layer or a metal compound layer. That is, the second material layer 152 may be formed of the same material layer as the first material layer 132. However, in the exemplary embodiments, any materials having an etch selectivity with respect to the first material patterns 136 and the first to third interlayer insulation layers 106, 110 and 114 in a predetermined etchant can be used as the second material layer 152.

Figure 4K:
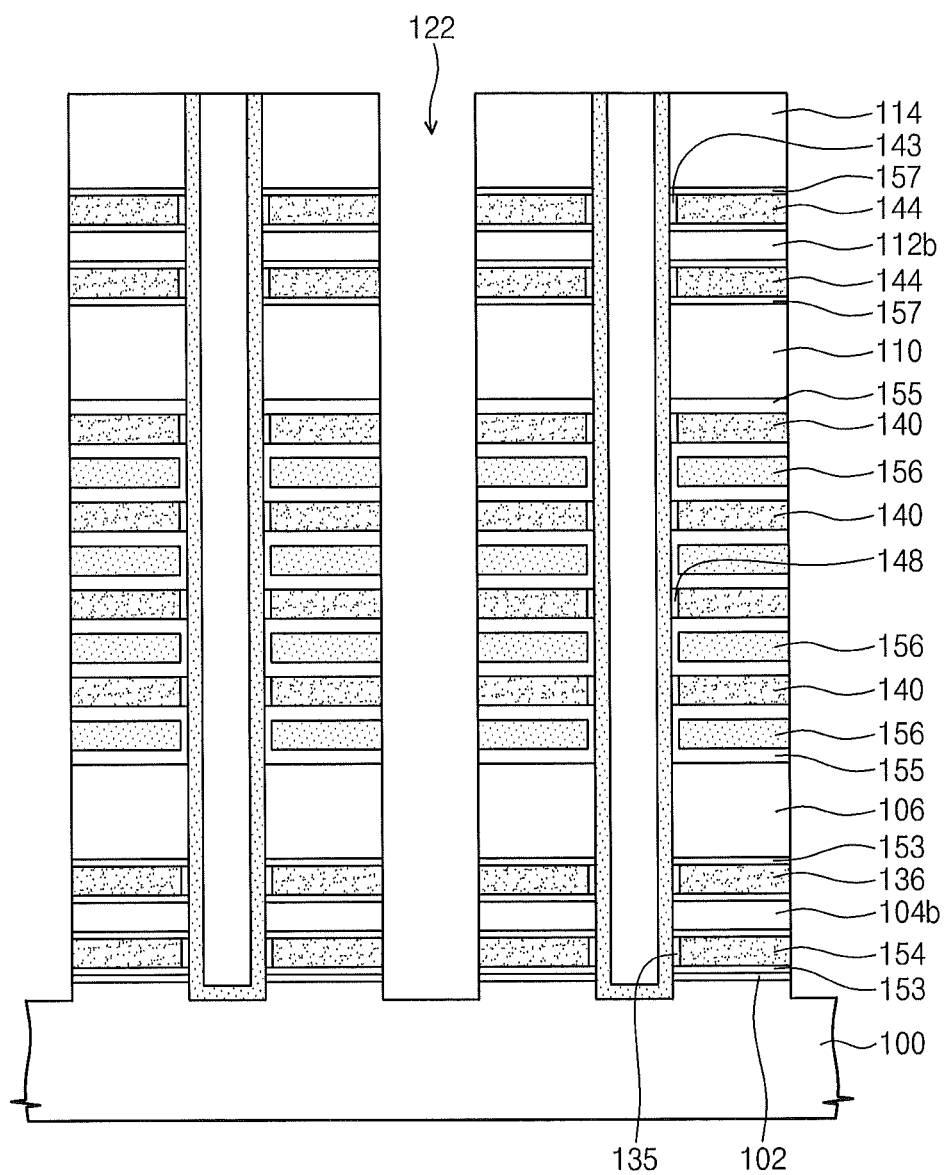

Referring to FIG. 4K, the second material layer 152 and the second dielectric layer 150 may be etched using the third interlayer insulation layer 114 as an etch stop layer, thereby exposing sidewalls of the first to third interlayer insulation layers 106, 110 and 114 and sidewalls of the first to third material patterns 136, 140 and 144. As a result, fourth to sixth dielectric patterns 153, 155 and 157 and fourth material patterns 156 may be formed. While the fourth to sixth dielectric patterns 153, 155 and 157 and the fourth material patterns 156 are formed, the second material layer 152 and the second dielectric layer 150 in the trench 122 may be removed to expose the substrate 100 under the trench 122.

The fourth dielectric patterns 153 may be formed to cover the top and bottom surfaces of the first material patterns 136, and the sixth dielectric patterns 157 may be formed to cover the top and bottom surfaces of the third material patterns 144. Each of the fifth dielectric patterns 155 may include a first portion between the vertical active patterns 118 and the fourth material pattern 156, and a second portion extending from the first portion to cover a top surface and a bottom surface of the fourth material pattern 156.

Figure 4L:
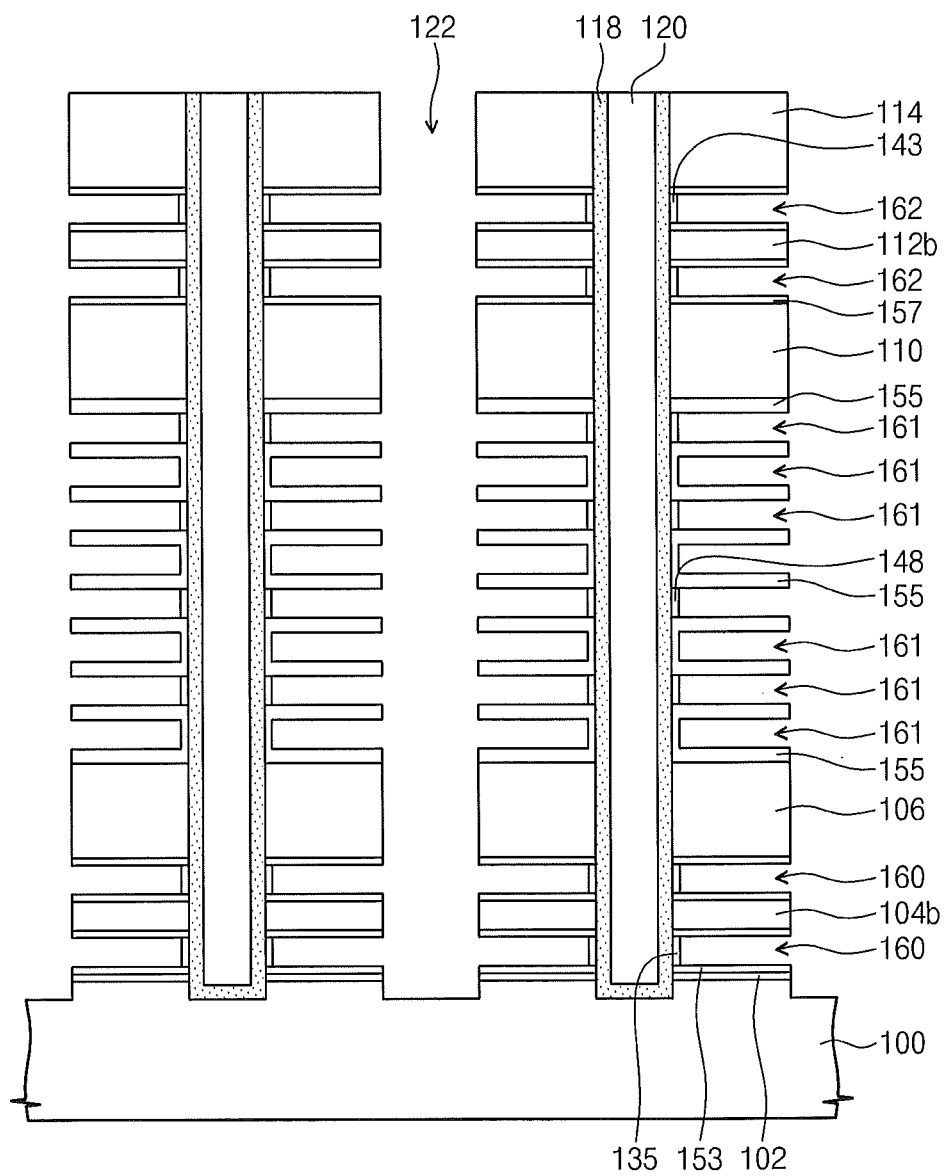

Referring to FIG. 4L, the first to fourth material patterns 136, 140, 144 and 156 may be removed to form fifth to seventh recessed regions 160, 161 and 162. The fifth recessed regions 160 may be formed by removal of the first material patterns 136. The fifth recessed regions 160 may correspond to spaces in which gate patterns of the ground selection transistors are formed in a subsequent process. The sixth recessed regions 161 may be formed by removal of the second and fourth material patterns 140 and 156. The sixth recessed regions 161 may correspond to spaces in which gate patterns of the memory cell transistors are formed in a subsequent process. The seventh recessed regions 162 may be formed by removal of the third material patterns 144. The seventh recessed regions 162 may correspond to spaces in which gate patterns of the string selection transistors are formed in a subsequent process. When the first to fourth material patterns 136, 140, 144 and 156 are formed of a silicon layer, the first to fourth material patterns 136, 140, 144 and 156 may be removed using a dry etching process that employs a chlorine gas and an oxygen gas as etching gases.

Figure 4M:
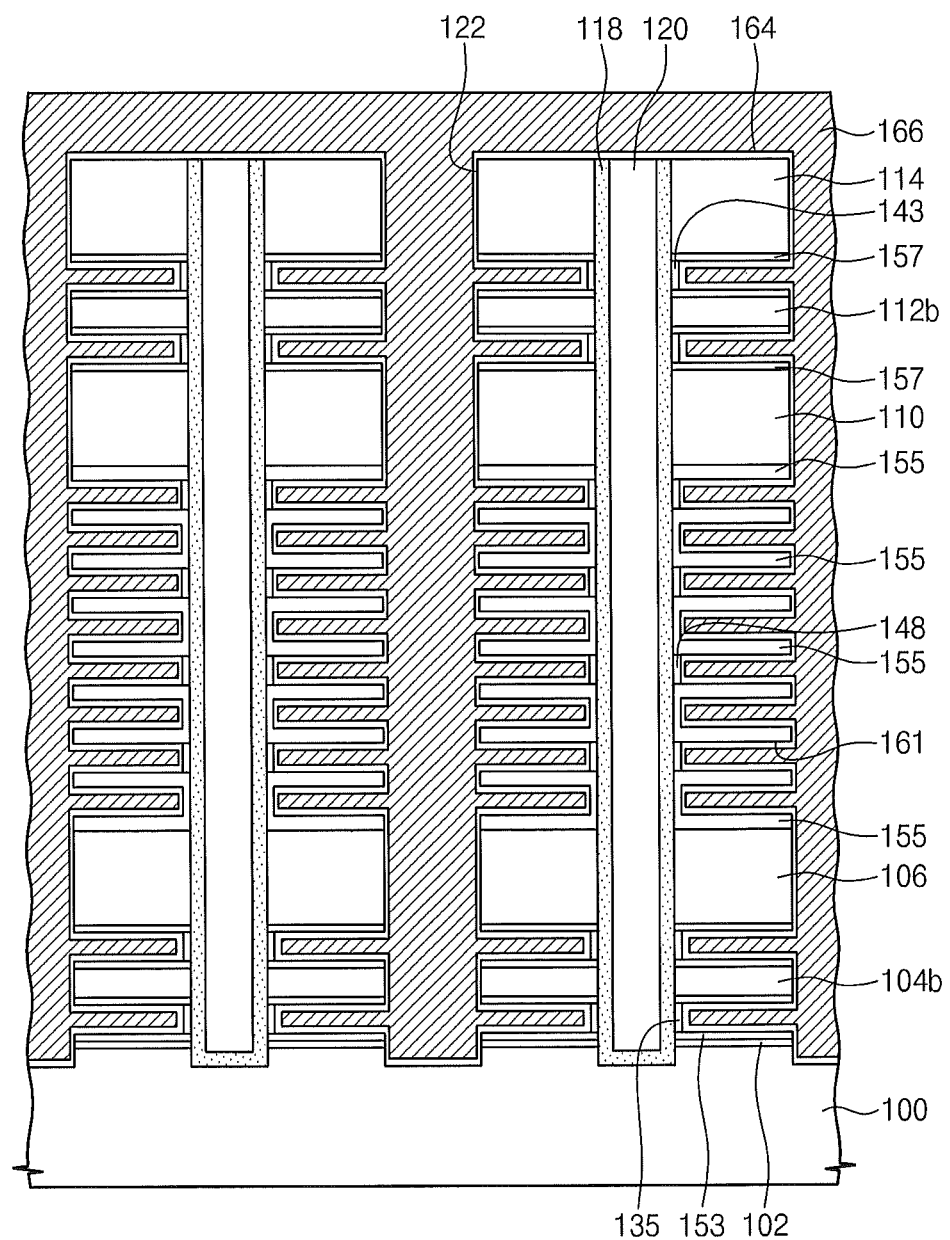

Referring to FIG. 4M, a metal oxide layer 164 and a second conductive layer 166 may be sequentially formed on the substrate including the trench 112 and the fifth to seventh recessed regions 160, 161 and 162. The metal oxide layer 164 may be conformally formed on the substrate including the fifth to seventh recessed regions 160, 161 and 162, and the second conductive layer 166 may be formed on the metal oxide layer 164 to fill the trench 122 and the fifth to seventh recessed regions 160, 161 and 162.

A thickness of the metal oxide layer 164 formed on the sidewalls of the vertical active patterns 118 may be substantially different from a thickness of the metal oxide layer 164 formed on top the surfaces and bottom surfaces of the fourth to sixth dielectric patterns 153, 155 and 157. For example, the thickness of the metal oxide layer 164 formed on the sidewalls of the vertical active patterns 118 may be substantially less than the thickness of the metal oxide layer 164 formed on the top surfaces and the bottom surfaces of the fourth to sixth dielectric patterns 153, 155 and 157. Alternatively, the thickness of the metal oxide layer 164 formed on the sidewalls of the vertical active patterns 118 may be substantially equal to the thickness of the metal oxide layer 164 formed on the top surfaces and the bottom surfaces of the fourth to sixth dielectric patterns 153, 155 and 157.

The second conductive layer 166 may be formed to include a polysilicon layer, a metal silicide layer, a metal layer or metal compound layer. For example, the second conductive layer 166 may be formed of a nickel silicide (NiSi) layer, a titanium nitride (TiN) layer, a tungsten nitride (WN) layer, a tungsten (W) layer, an aluminum (Al) layer or a copper (Cu) layer. The second conductive layer 166 may be formed using a selective epitaxial growth (SEG) process. In the event that the second conductive layer 166 is formed using a selective epitaxial growth (SEG) process, the second conductive layer 166 may be formed of a doped polysilicon layer, an undoped polysilicon layer, a laser re-crystallized silicon layer or a silicon germanium layer. Prior to formation of the second conductive layer 166, a barrier layer (not shown) may be additionally and conformally formed on the metal oxide layer 164.

Figure 4N:
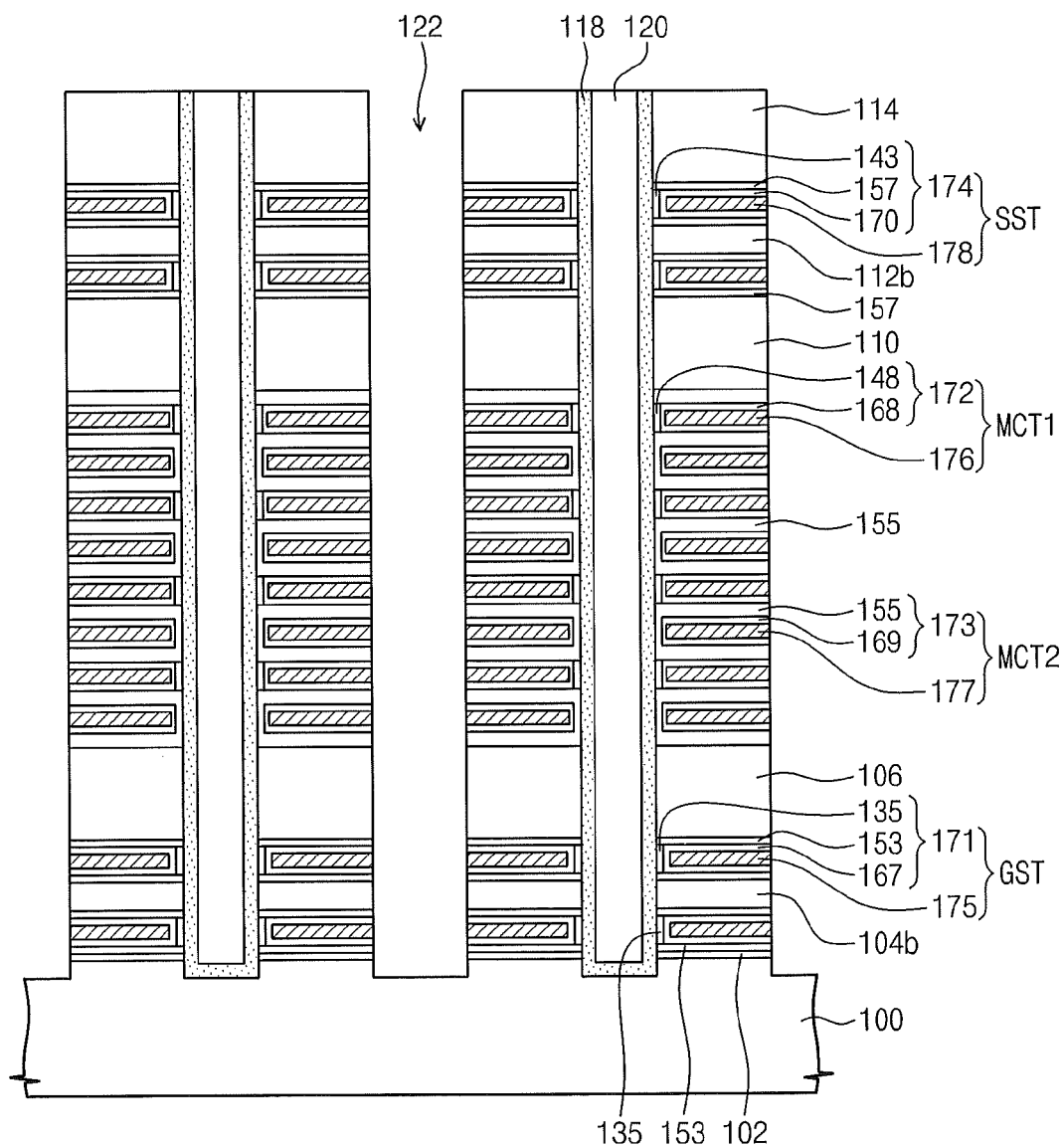
Figure 40:
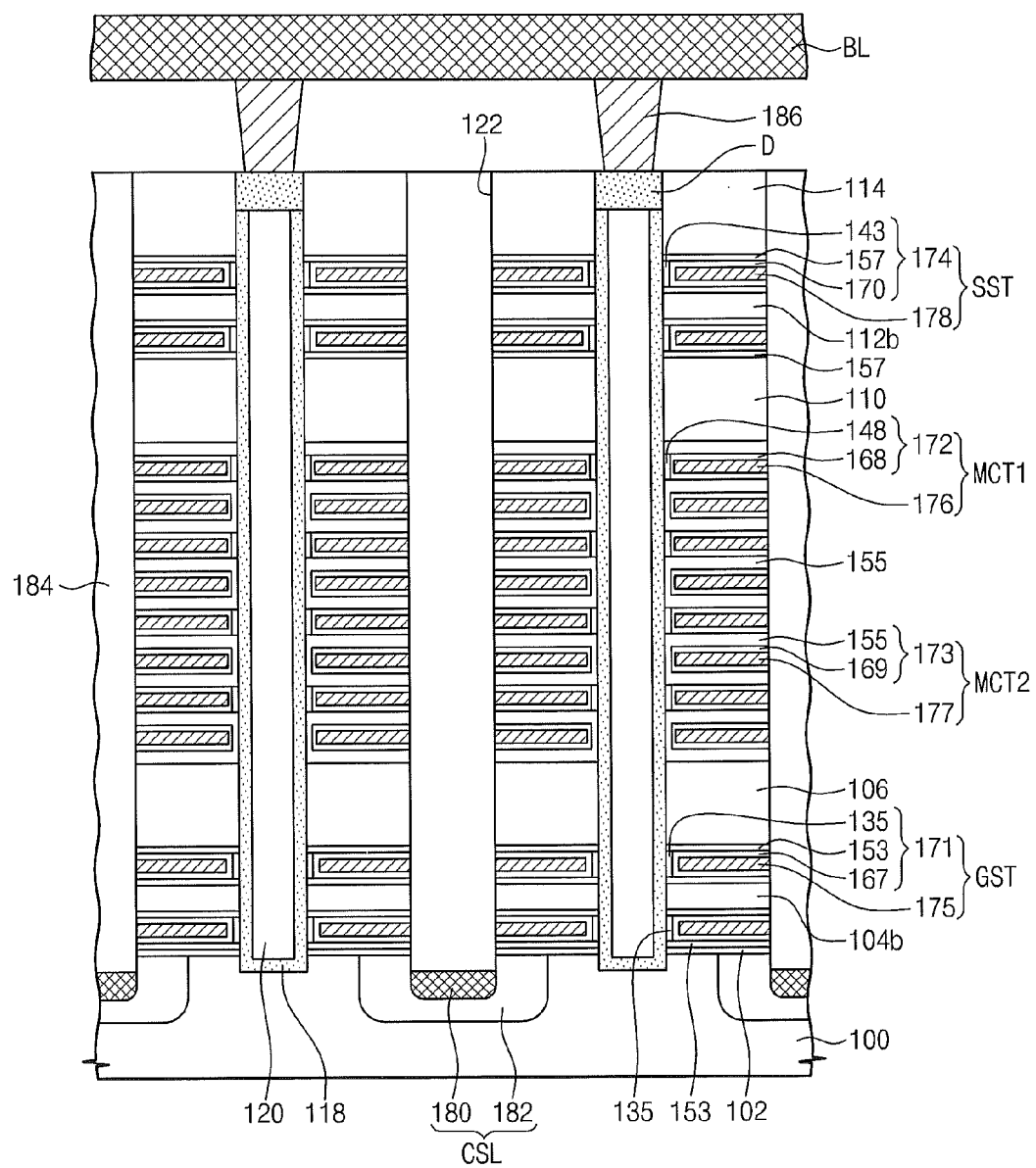

Referring to FIG. 4N, the second conductive layer 166 and the metal oxide layer 164 may be etched using the third interlayer insulation layer 114 as an etch stop layer, thereby exposing sidewalls of the first to third interlayer insulation layers 106, 110 and 114 and sidewalls of the fourth to sixth dielectric patterns 153, 155 and 157. As a result, first to third metal oxide patterns 167, 168 (or 169) and 170 and first to third conductive patterns 175, 176 (or 177) and 178 may be formed. While the first to third metal oxide patterns 167, 168 (or 169) and 170 and the first to third conductive patterns 175, 176 (or 177) and 178 are formed, the second conductive layer 166 and the metal oxide layer 164 in the trench 122 may be removed to expose the substrate 100 under the trench 122.

The first metal oxide pattern 167 and the first conductive pattern 175 surrounded by the first metal oxide pattern 167 may be formed in each of the fifth recessed regions (160 of FIG. 4L). The first dielectric pattern 135, the fourth dielectric pattern 153 and the first metal oxide pattern 167 may constitute a gate insulation layer 171 of a ground selection transistor GST, and the first conductive pattern 175 may act as a gate electrode (e.g., a ground selection line) of the ground selection transistor GST. The second metal oxide pattern 168 (or 169) and the second conductive pattern 176 (or 177) surrounded by the second metal oxide pattern 168 (or 169) may be formed in each of the sixth recessed regions (161 of FIG. 4L). The second dielectric pattern 148 and the second metal oxide pattern 168 may constitute a gate insulation layer 172 of a first memory cell transistor MCT1, and the second conductive pattern 176 may act as a gate electrode (e.g., a word line) of the first memory cell transistor MCT1. Similarly, the fifth dielectric pattern 155 and the second metal oxide pattern 169 may constitute a gate insulation layer 173 of a second memory cell transistor MCT2, and the second conductive pattern 177 may act as a gate electrode (e.g., a word line) of the second memory cell transistor MCT2.

The third metal oxide pattern 170 and the third conductive pattern 178 surrounded by the third metal oxide pattern 170 may be formed in each of the seventh recessed regions (162 of FIG. 4L). The third dielectric pattern 143, the sixth dielectric pattern 157 and the third metal oxide pattern 170 may constitute a gate insulation layer 174 of a string selection transistor SST, and the third conductive pattern 178 may act as a gate electrode (e.g., a string selection line) of the string selection transistor SST.

Referring FIG. 4O, a common source line CSL and drain regions (D) may be formed in the substrate 100 under the trench 122 and in upper portions of the vertical active patterns 118, respectively. A bit line BL may be formed over the drain regions D. The common source line CSL may be formed in the substrate 100 exposed by the trench 122 using an ion implantation process. The common source line CSL may be formed to include an impurity region 182 and a metal silicide region 180. An insulation layer 184 may be formed to fill the trench 122. The insulation layer 184 may be formed to include an oxide layer, a nitride layer or an oxynitride layer. The drain regions D may be formed by implanting impurities into the upper portions of the vertical active patterns 118. The bit line BL may be electrically connected to the drain regions D through contact plugs 186.

Figure 5A:
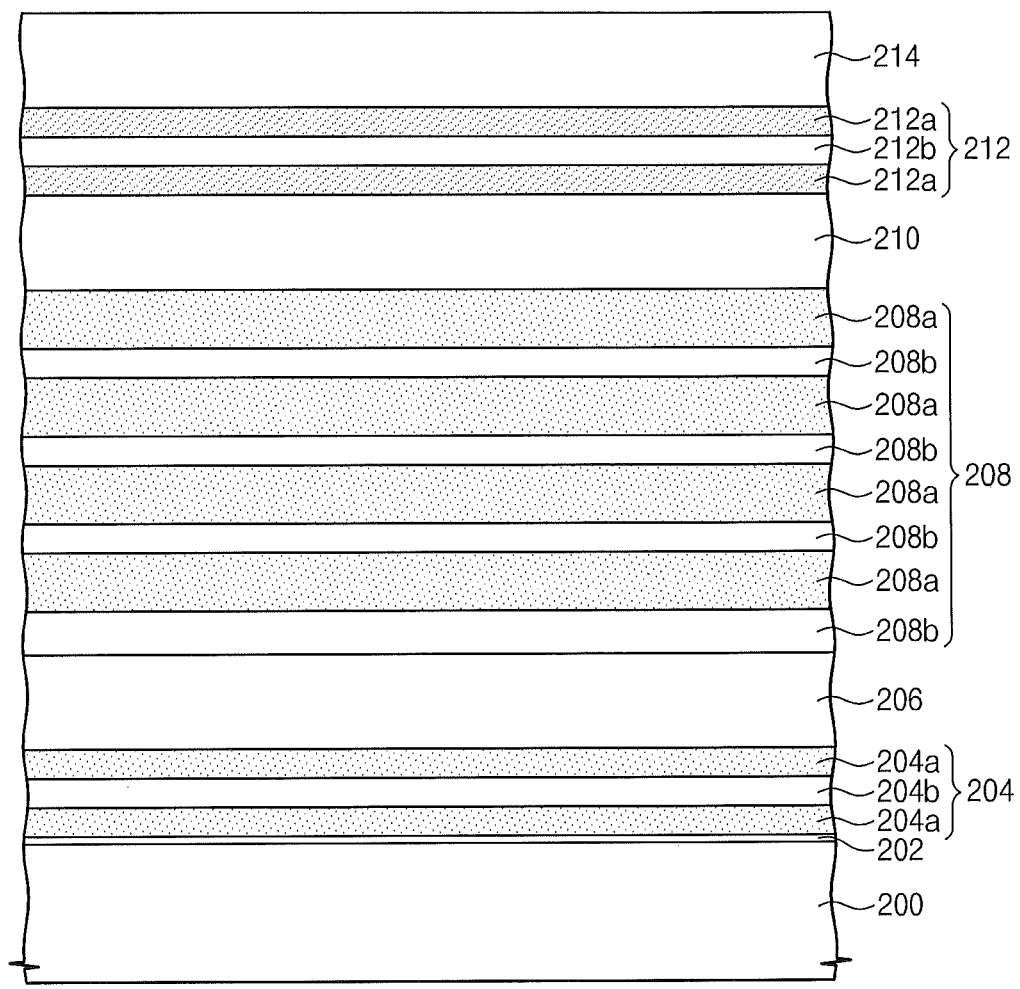
FIGS. 5A through 5I are cross sectional views illustrating a method of manufacturing a three-dimensional semiconductor memory device according to another embodiment.
Figure 5B:
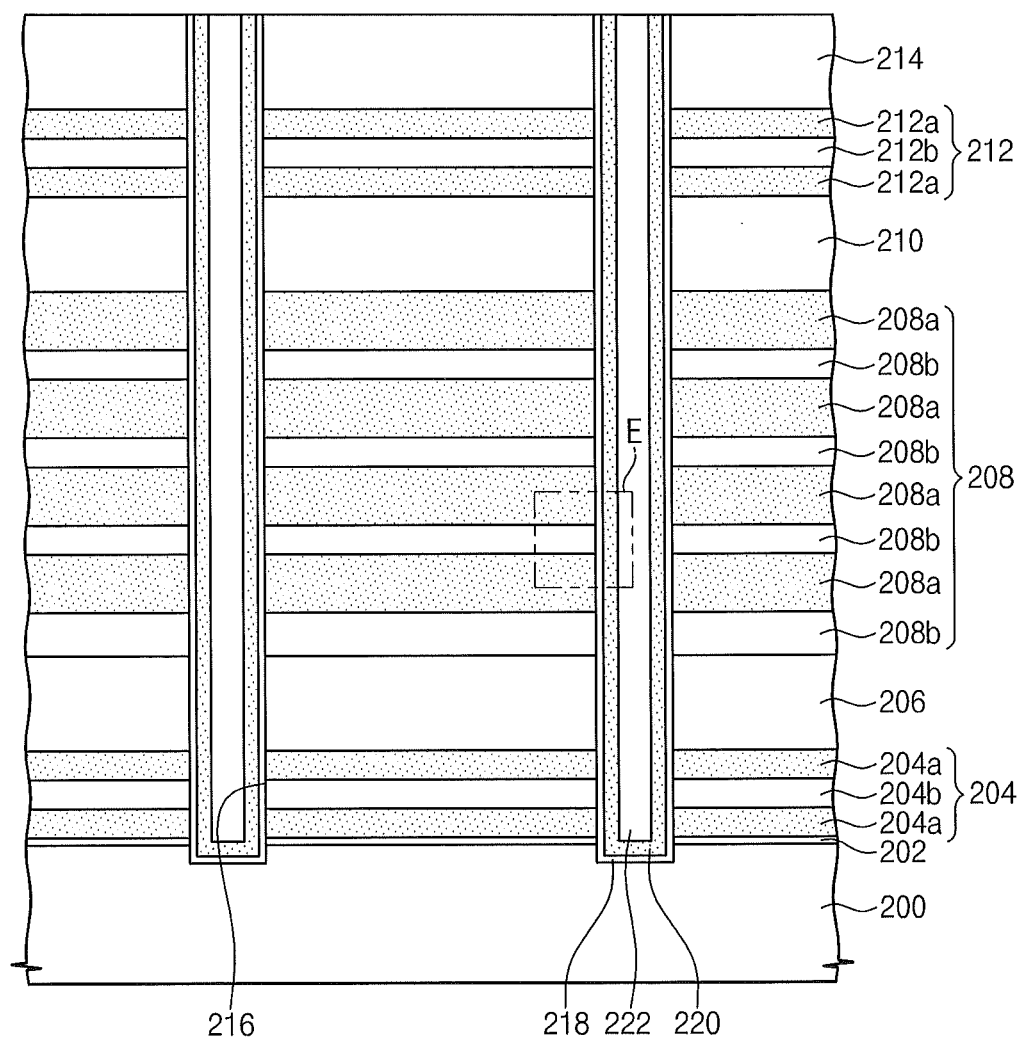

FIGS. 5A through 5I are cross sectional views illustrating a method of manufacturing a three-dimensional semiconductor memory device according to another embodiment. Referring to FIG. 5A, a buffer insulation layer 202, a first film structure 204, a first interlayer insulation layer 206, a second film structure 208, a second interlayer insulation layer 210, a third film structure 212 and a third interlayer insulation layer 214 may be sequentially formed on a substrate 200. Referring to FIG. 5B, data storage patterns 218, vertical active patterns 220 and buried insulation patterns 222 may be formed to penetrate the buffer insulation layer 202, the first film structure 204, the first interlayer insulation layer 206, the second film structure 208, the second interlayer insulation layer 210, the third film structure 212 and the third interlayer insulation layer 214.

Specifically, the first to third interlayer insulation layers 206, 210 and 214, the first to third film structures 204, 208 and 212, and the buffer layer 202 may be patterned to form though holes 216 exposing portions of the substrate 200. A data storage layer (not shown) may be conformally formed on the substrate including the through holes 216. That is, the data storage layer may be formed not to fill the through holes 216.

A first conductive layer (not shown) may also be conformally formed on the data storage layer. That is, the first conductive layer may also be formed not to fill the through holes 216. A buried insulation layer may be then formed on the first conductive layer. The buried insulation layer may be formed to fill the through holes 216. The buried insulation layer, the first conductive layer and the data storage layer may be planarized to expose a top surface of the third interlayer insulation layer 214 and to concurrently form the data storage pattern 218, the vertical active pattern 220 and the buried insulation pattern 222 in each of the through holes 216. Each of the data storage pattern 218 and the vertical active pattern 220 may have a cylindrical shape with an empty space therein and may have a closed bottom portion. The data storage pattern 218 may surround the vertical active pattern 220, and the empty spaces in the vertical active patterns 218 may be filled with the buried insulation pattern 222.

Figure 5C:
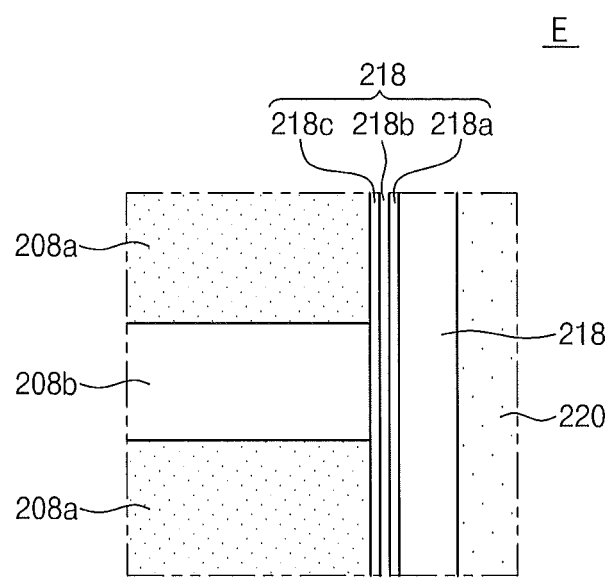
Figure 5D:
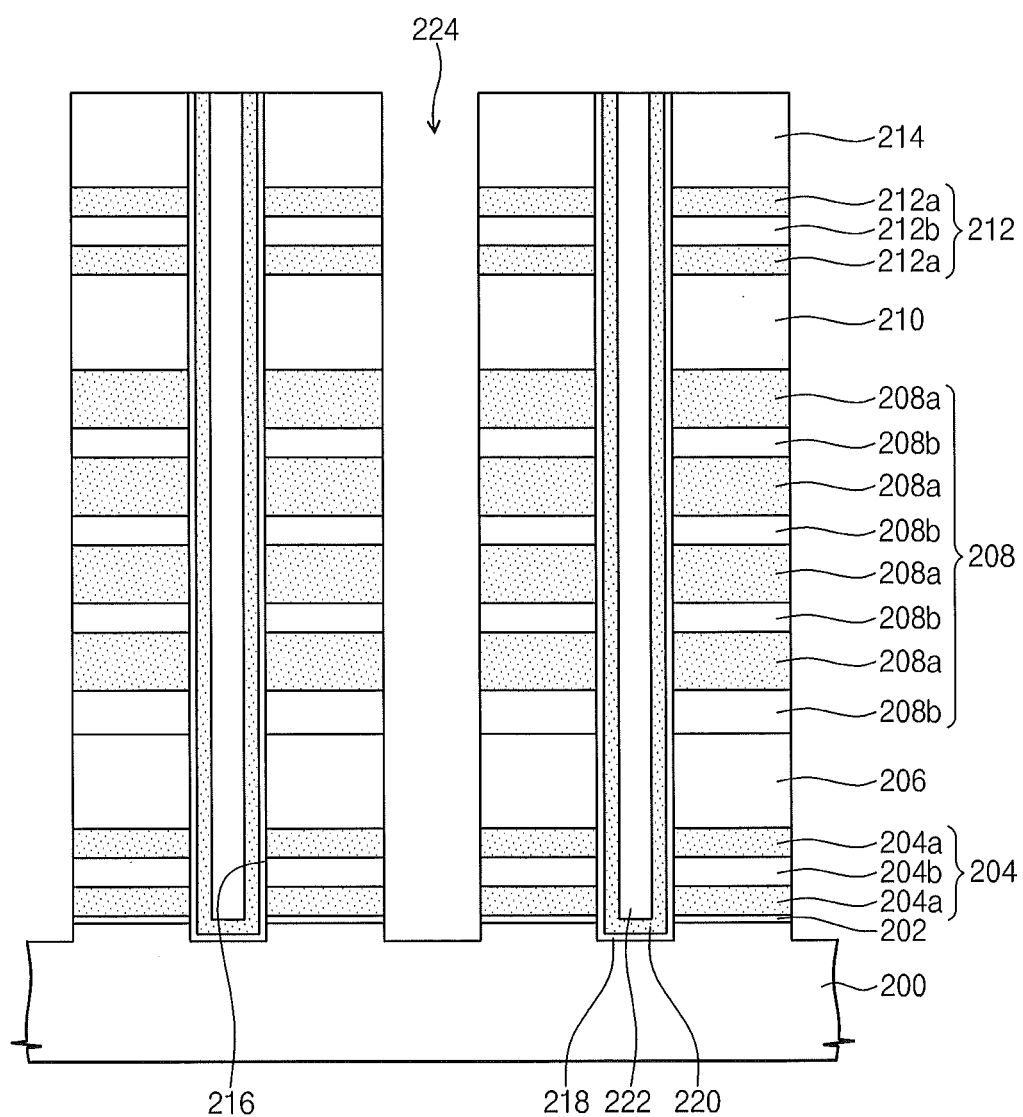
Figure 5E:
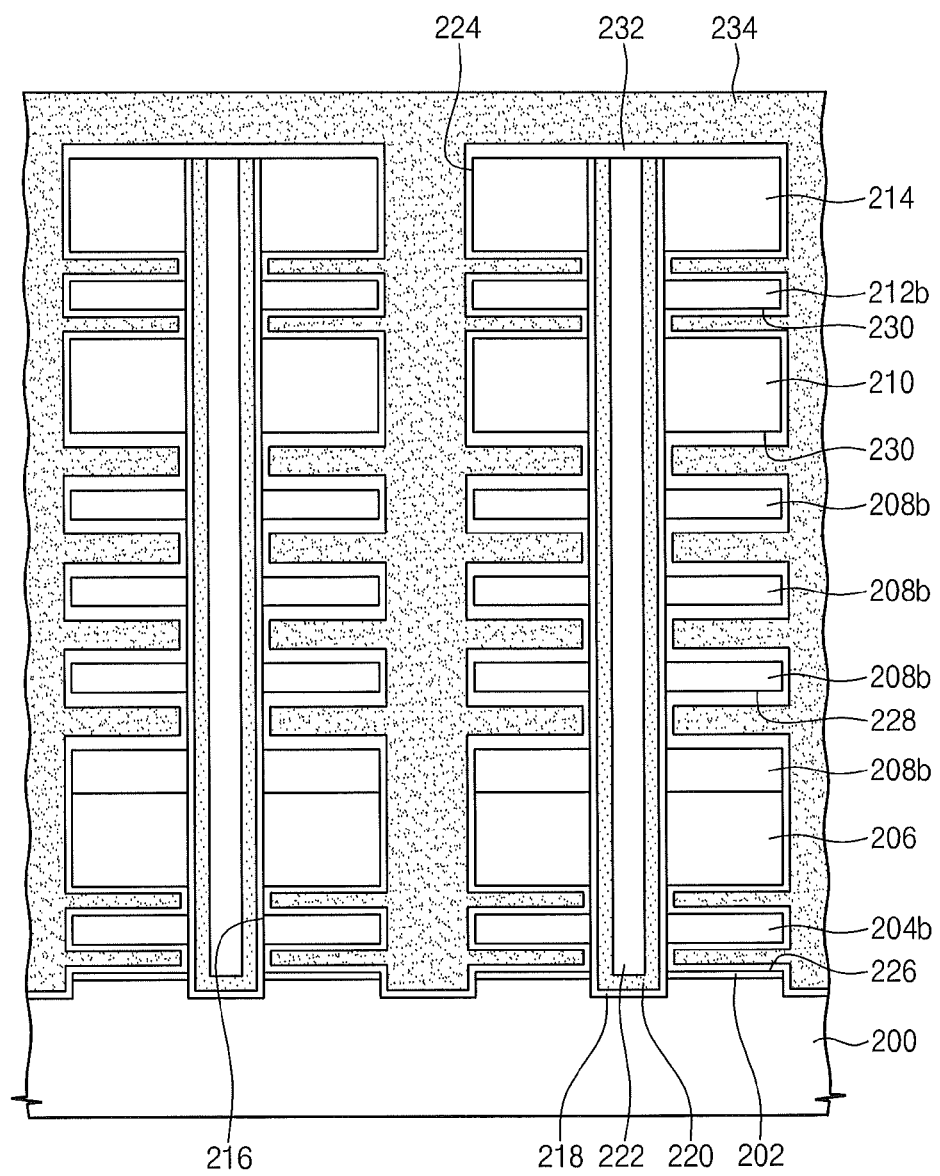

FIG. 5C is an enlarged view illustrating a portion 'E' of FIG. 5B. Referring to FIG. 5C, each of the data storage patterns 218 may be formed by sequentially stacking a tunnel insulation layer 218a, a charge storage layer 218b and a barrier dielectric layer 218c. Referring to FIG. 5D, the first to third interlayer insulation layers 206, 210 and 214, the first to third film structures 204, 208 and 212, and the buffer insulation layer 202 may be etched to form a trench 224 exposing the substrate 100 and extending in a direction. The trench 224 may also expose the first, third and fifth layers 204a, 208a and 212a. Referring to FIG. 5E, the first, third and fifth layers 204a, 208a and 212a exposed by the trench 224 may be removed to form first recessed regions 226, second recessed regions 228 and third recessed regions 230. A first metal oxide layer 232 and a first material layer 234 may be formed on the substrate including the first to third recessed regions 226, 228 and 230.

According to some embodiments of the invention, the first recessed regions 226 may correspond to spaces to be filled with gate patterns of ground selection transistors in a subsequent process, and the second recessed regions 228 may correspond to spaces to be filled with gate patterns of memory cell transistors in a subsequent process. Further, the third recessed regions 230 may correspond to spaces to be filled with gate patterns of string selection transistors in a subsequent process. The first metal oxide layer 232 may be conformally formed on the substrate including the first to third recessed regions 226, 228 and 230. That is, the first metal oxide layer 232 may be formed not to fill the first to third recessed regions 226, 228 and 230. The first material layer 234 may be formed on the first metal oxide layer 232 to fill the trench 224 and the first to third recessed regions 226, 228 and 230.

Figure 5F:
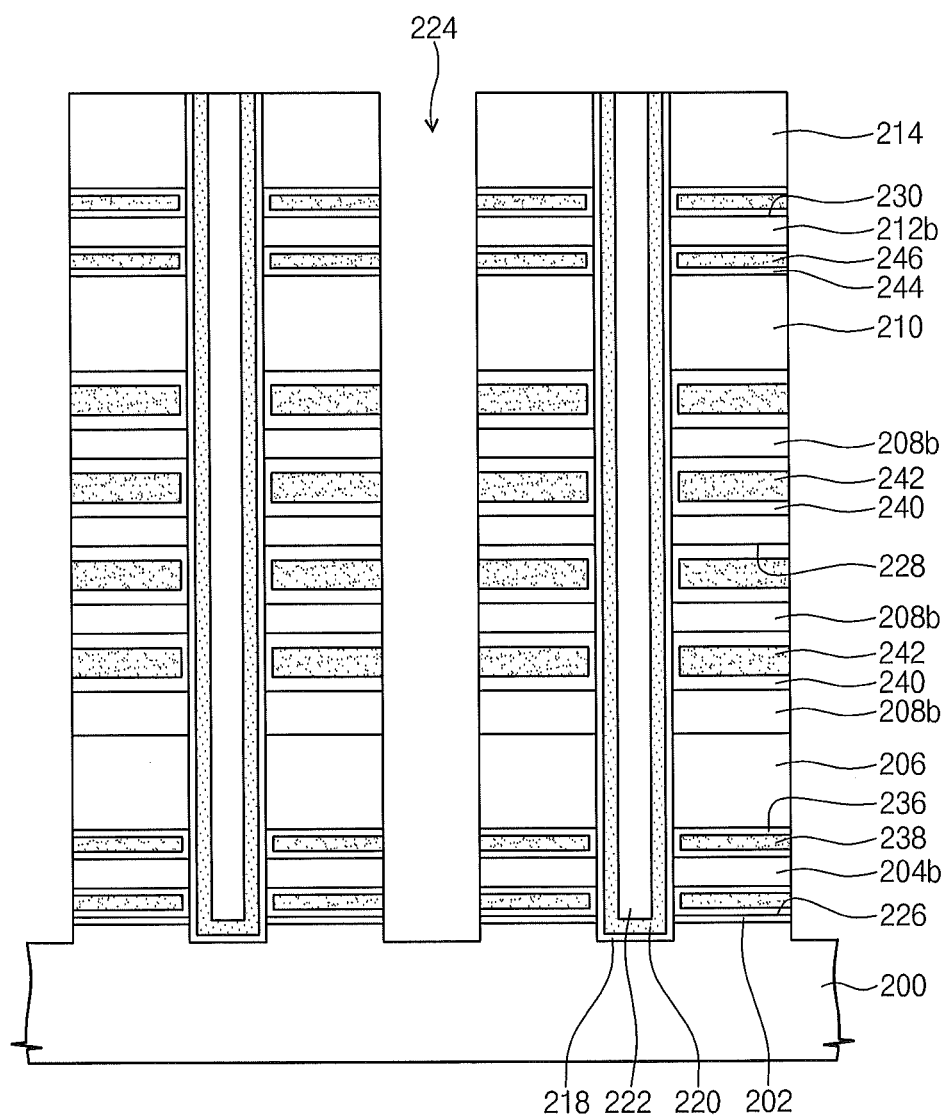

Referring to FIG. 5F, the first material layer 234 and the first metal oxide layer 232 may be etched using the third interlayer insulation layer 214 as an etch stop layer, thereby exposing sidewalls of the first to third interlayer insulation layers 206, 210 and 214 and sidewalls of the second, fourth and sixth layers 204b, 208b and 212b. As a result, first to third preliminary metal oxide patterns 226, 240 and 244 as well as first to third material patterns 238, 242 and 246 may be formed. While the first to third preliminary metal oxide patterns 226, 240 and 244 as well as first to third material patterns 238, 242 and 246 are formed, the first material layer 234 and the first metal oxide layer 232 in the trench 224 may be removed to expose the substrate 200 under the trench 224.

The first preliminary metal oxide pattern 226 and the first material pattern 238 surrounded by the first preliminary metal oxide pattern 226 may be formed in each of the first recessed regions 226, and the second preliminary metal oxide pattern 240 and the second material pattern 242 surrounded by the second preliminary metal oxide pattern 240 may be formed in each of the second recessed regions 228. In addition, the third preliminary metal oxide pattern 244 and the third material pattern 246 surrounded by the third preliminary metal oxide pattern 244 may be formed in each of the third recessed regions 230.

Figure 5G:
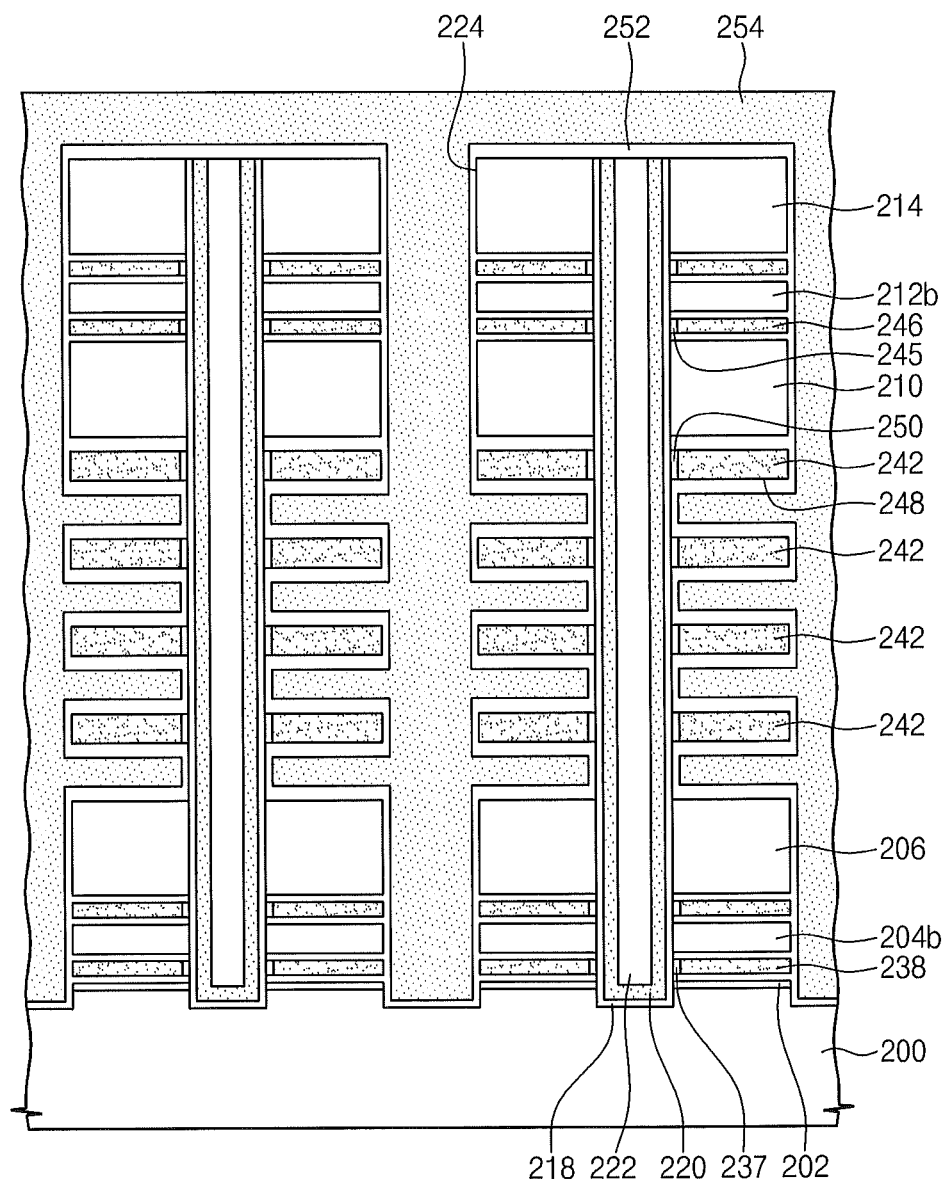

Referring to FIG. 5G, the fourth layers 208b may be removed to form fourth recessed regions 248, and a second metal oxide layer 252 and a second material layer 254 may be formed on the substrate having the fourth recessed regions 248. In an embodiment, if the fourth layers 208b include a silicon oxide layer, portions of the first to third preliminary dielectric patterns 236, 240 and 244 covering top and bottom surfaces of the first to third material patterns 238, 242 and 246 may be partially etched while the fourth layers 208b are removed. After the first to third preliminary dielectric patterns 236, 240 and 244 are partially etched, first, second and third metal oxide patterns 237, 250 and 245 may be formed between the vertical active patterns 220 and the first to third material patterns 238, 242 and 246. That is, the top and bottom surfaces of the first and third material patterns 238, 242 and 246 may be exposed to form spaces on the top and bottom surfaces of the first and third material patterns 238 and 246.

Figure 5H:
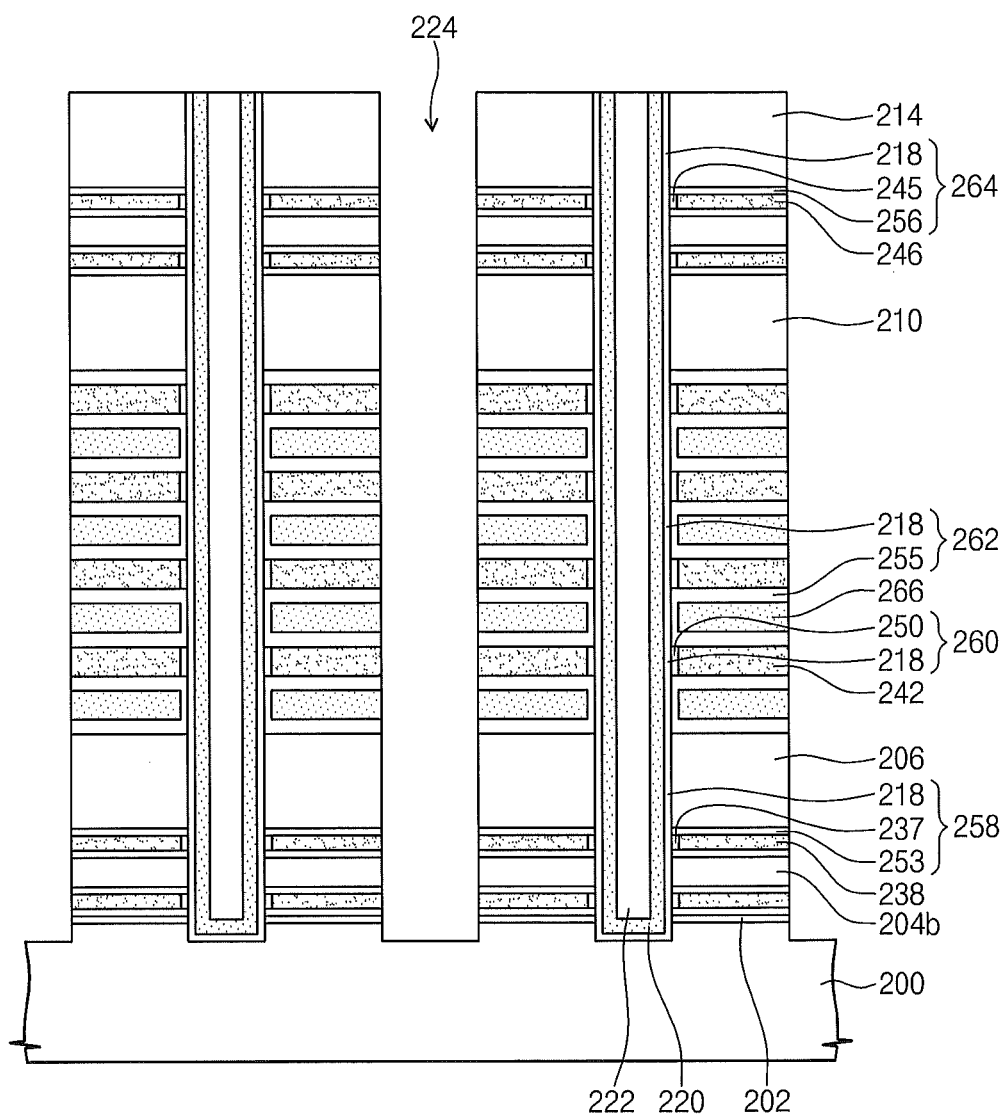

The second metal oxide layer 252 may be conformally formed on the substrate including the fourth recessed regions 248. That is, the second metal oxide layer 252 may be formed not to fill the fourth recessed regions 248. Meanwhile, the second metal oxide layer 252 may be formed to fill the spaces on the top and bottom surfaces of the first and third material patterns 238 and 246. The second material layer 254 may be formed on the second metal oxide layer 252 to fill the trench 224 and the fourth recessed regions 248. Referring to FIG. 5H, the second material layer 254 and the second metal oxide layer 252 may be etched using the third interlayer insulation layer 214 as an etch stop layer, thereby exposing sidewalls of the first to third interlayer insulation layers 206, 210 and 214 and sidewalls of the first to third material patterns 238, 242 and 246. As a result, fourth to sixth metal oxide patterns 253, 255 and 256 and fourth material patterns 266 may be formed. While the fourth to sixth metal oxide patterns 253, 255 and 256 and fourth material patterns 266 are formed, the second material layer 254 and the second metal oxide layer 252 in the trench 224 may be removed to expose the substrate 200 under the trench 224.

Figure 5I:
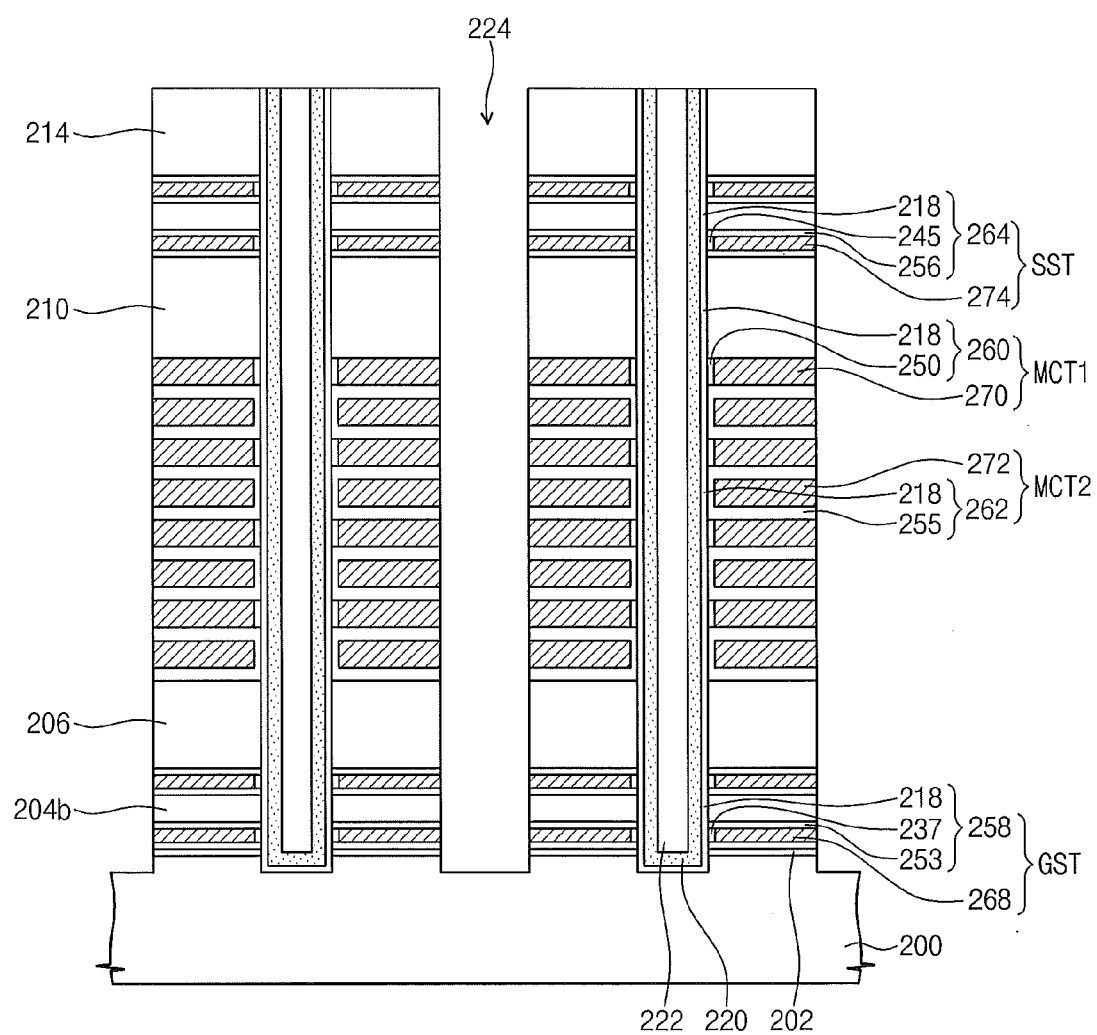

Referring to FIG. 5I, the first to fourth material patterns 253, 242, 246 and 266 may be removed to form fifth to seventh recessed regions, and first to third conductive patterns 268, 270 (or 272) and 274 may be formed in the fifth to seventh recessed regions, respectively. Specifically, the fifth recessed regions may be formed by removal of the first material patterns 253. The fifth recessed regions may correspond to spaces in which gate patterns of the ground selection transistors are formed in a subsequent process. The sixth recessed regions may be formed by removal of the second and fourth material patterns 242 and 266. The sixth recessed regions may correspond to spaces in which gate patterns of the memory cell transistors are formed in a subsequent process. The seventh recessed regions may be formed by removal of the third material patterns 246. The seventh recessed regions may correspond to spaces in which gate patterns of the string selection transistors are formed in a subsequent process.

Subsequently, a second conductive layer may be formed on the substrate including the fifth to seventh recessed regions. The second conductive layer may be formed to fill the fifth to seventh recessed regions. The second conductive layer may be etched using the third interlayer insulation layer 114 as an etch stop layer, thereby exposing sidewalls of the first to third interlayer insulation layers 206, 210 and 214. As a result, first to third conductive patterns 268, 270 (or 272) and 274 may be formed in the fifth to seventh recessed regions, respectively. While the first to third conductive patterns 268, 270 (or 272) and 274 are formed, the second conductive layer in the trench 224 may be removed to expose the substrate 200 under the trench 224.

The data storage pattern 218, the first metal oxide pattern 237 and the fourth metal oxide pattern 253 may constitute a gate insulation layer 258 of a ground selection transistor GST, and the first conductive pattern 268 may act as a gate electrode (e.g., a ground selection line) of the ground selection transistor GST. The data storage pattern 218 and the second metal oxide pattern 250 may constitute a gate insulation layer 260 of a first memory cell transistor MCT1, and the second conductive pattern 270 may act as a gate electrode (e.g., a word line) of the first memory cell transistor MCT1. Similarly, the data storage pattern 218 and the fifth metal oxide pattern 255 may constitute a gate insulation layer 262 of a second memory cell transistor MCT2, and the second conductive pattern 272 may act as a gate electrode (e.g., a word line) of the second memory cell transistor MCT2.

The data storage pattern 218, the third metal oxide pattern 245 and the sixth metal oxide pattern 256 may constitute a gate insulation layer 264 of a string selection transistor SST, and the third conductive pattern 274 may act as a gate electrode (e.g., a string selection line) of the string selection transistor SST. Although not shown in the figures, common source lines, drain regions and bit lines may be then formed using the same manners as described with reference to FIG. 4O.

Figure 6A:
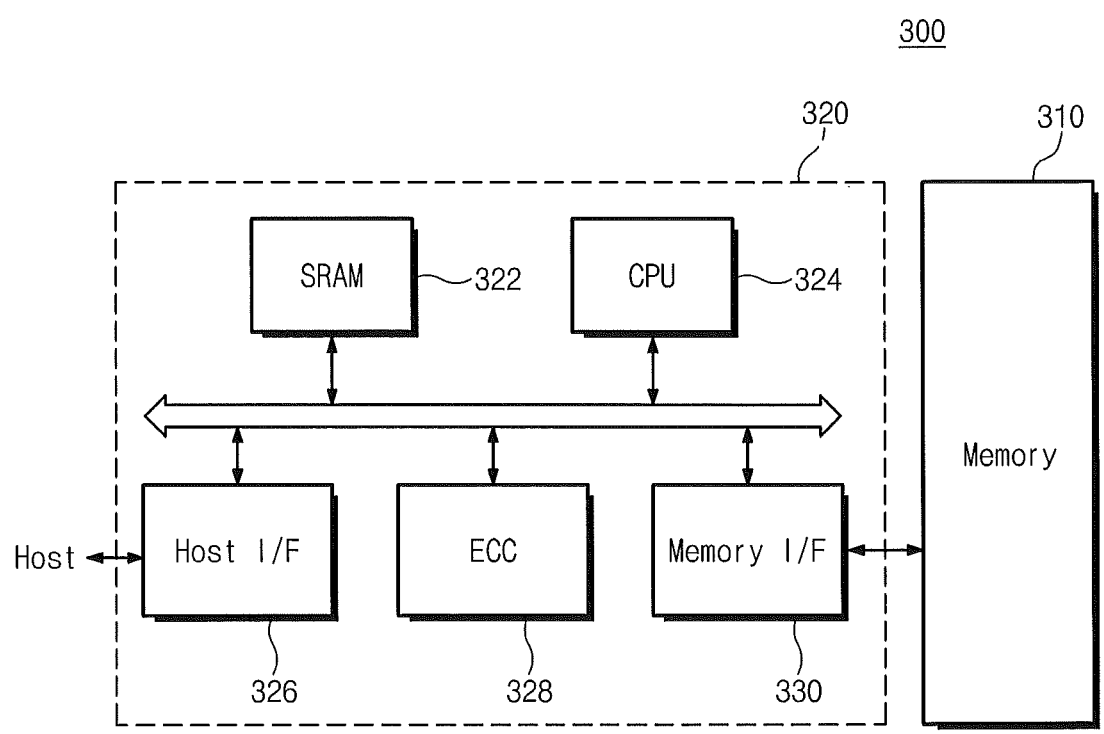
FIG. 6A is a block diagrams illustrating an example of memory cards including three-dimensional semiconductor devices according to the exemplary embodiments.

FIG. 6A is a block diagrams illustrating an example of memory cards including three-dimensional semiconductor devices according to the exemplary embodiments. Referring to FIG. 6A, the three-dimensional semiconductor memory devices described in the above embodiments may be applied to a memory card 300. The memory card 300 may include a host, a memory device 310, and a memory controller 320. The memory controller 320 may control data communication between the host and the memory device 310. The memory controller 320 may include a static random access memory (SRAM) device 322 and a central processing unit (CPU) 324. The SRAM device 322 may be used as an operation memory of the CPU 324. The memory controller 320 may further include a host interface unit 326. The host interface unit 326 may be configured to include a data communication protocol of the host. The memory controller 320 may further include an error check and correction (ECC) block 328. The ECC block 328 may detect and correct errors of data which are read out from the memory device 310. The memory controller 320 may further include a memory interface unit 330. The memory interface unit 330 may control the communication between the memory controller 320 and the memory device 310. The central processing unit (CPU) 324 may control overall operations of the memory controller 320. The memory device 310 may include at least one of the three-dimensional semiconductor memory devices according to the exemplary embodiments.

Figure 6B:
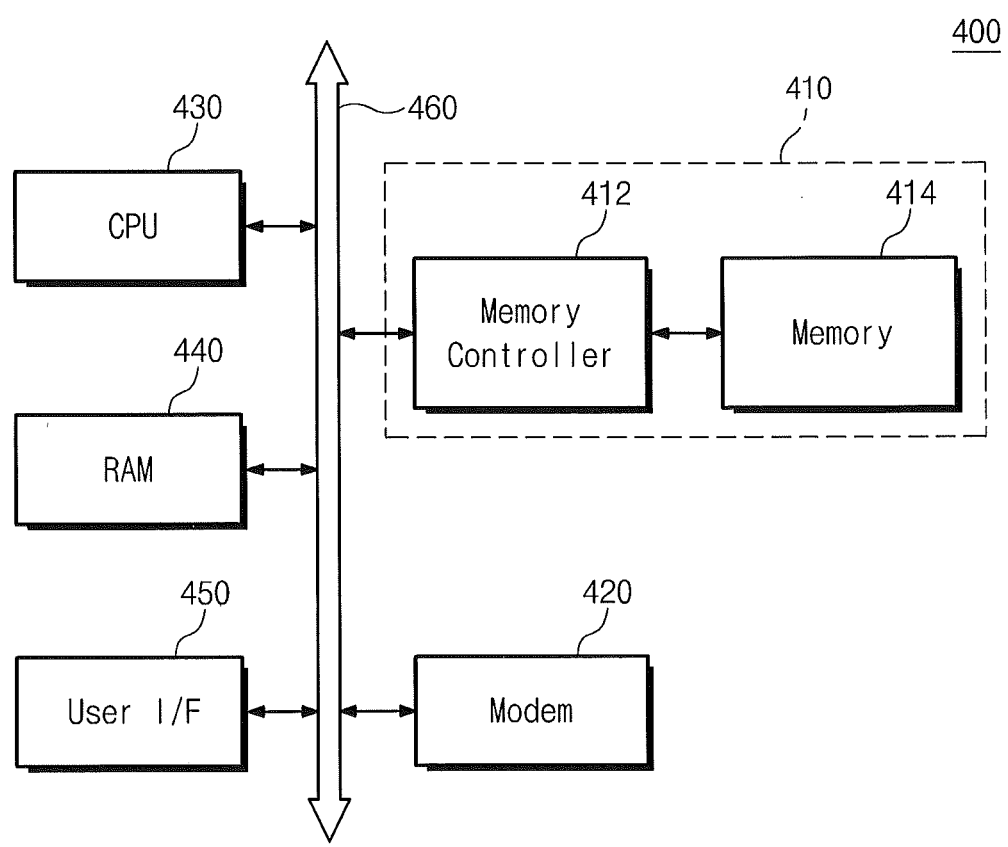
FIG. 6B is a block diagrams illustrating an example of information processing systems including three-dimensional semiconductor devices according to the exemplary embodiments.

FIG. 6B is a block diagrams illustrating an example of information processing systems including three-dimensional semiconductor devices according to the exemplary embodiments. Referring to FIG. 6B, an information processing system 400 may include a memory system 410, and the memory system 410 may include at least one of the three-dimensional semiconductor memory devices according to the exemplary embodiments. The information processing system 400 may be applied to a mobile system, a computer or the like.

In an embodiment, the information processing system 400 may further include a modulator-demodulator (MODEM) 420, a central processing unit (CPU) 430, a random access memory (RAM) device 440 and a user interface unit 450. The memory system 410, the modulator-demodulator (MODEM) 420, the central processing unit (CPU) 430, the random access memory (RAM) device 440 and the user interface unit 450 may communicate with each other through a data bus 460. The memory system 410 may store data processed by the CPU 430 or data transmitted from external system. The memory system 410 may include a memory device 414 and a memory controller 412, and may be configured to have substantially the same structure as the memory card 300 illustrated in FIG. 6A. The memory controller 412 may control overall operations of the memory device 414. The information processing system 400 may be configured to include a memory card, a solid state disk, a camera image processor or an application chipset. In an embodiment, the memory system 410 may include the solid state disk. In this case, the information processing system 400 may exhibit a stable and reliable operation since the solid state disk can stably store large data.

According to the embodiments set forth above, gate patterns, which are vertically stacked, can be spaced apart from each other by a dielectric layer used as a gate insulation layer. Thus, distances between the gate patterns can be reduced to improve the integration density of three-dimensional semiconductor devices. While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A nonvolatile memory device, comprising:
a vertical stack of nonvolatile memory cells on a substrate, said vertical stack of nonvolatile memory cells comprising a first nonvolatile memory cell having a first gate pattern therein separated from a vertical active region by a first multi-layered dielectric pattern having a first thickness, and a second nonvolatile memory cell having a second gate pattern therein separated from the vertical active region by a second multi-layered dielectric pattern having a second thickness equivalent to the first thickness and also separated from the first gate pattern by a portion of the first multi-layered dielectric pattern but not a corresponding portion of the second multi-layer dielectric pattern.

2. The nonvolatile memory device of claim 1, wherein the first multi-layered dielectric pattern comprises a first tunnel insulating layer on the vertical active region, a first charge storage layer on the first tunnel insulating layer, a first barrier layer on the first charge storage layer and a first metal oxide layer on the first barrier layer; and wherein the first and second gate patterns are vertically separated from each other by the first metal oxide layer.

3. The nonvolatile memory device of claim 2, wherein the first metal oxide layer contacts first and second surfaces of the first and second gate patterns, respectively.

4. The nonvolatile memory device of claim 3, wherein the first and second gate patterns are immediately adjacent gate patterns within said vertical stack of nonvolatile memory cells; and wherein the first and second surfaces of the first and second gate patterns face each other.

5. The nonvolatile memory device of claim 2, wherein the second multi-layered dielectric pattern comprises a second tunnel insulating layer on the vertical active region, a second charge storage layer on the second tunnel insulating layer, a second barrier layer on the second charge storage layer and a second metal oxide layer on the second barrier layer; and wherein the first and second gate patterns are vertically separated from each other by the first tunnel insulating layer, the first charge storage layer, the first barrier layer, the first metal oxide layer and the second metal oxide layer, but not the second tunnel insulating layer, the second charge storage layer or the second barrier layer.

6. The nonvolatile memory device of claim 2, wherein the first metal oxide surrounds at least two surfaces of the first gate pattern.

7. The nonvolatile memory device of claim 6, wherein the first metal oxide includes a first part between the first gate pattern and the first barrier layer, and a second part extending from the first part and between the first and second gate patterns.

8. The nonvolatile memory device of claim 1, wherein facing lower and upper surfaces of the first and second gate patterns are separated from each other by a distance less than or equal to the first thickness.

9. A nonvolatile memory device, comprising:
a vertical stack of nonvolatile memory cells on a substrate, said vertical stack of nonvolatile memory cells comprising a first nonvolatile memory cell having a first gate pattern therein separated from a vertical active region by a first multi-layered dielectric pattern having a first thickness, and a second nonvolatile memory cell having a second gate pattern therein separated from the vertical active region by a second multi-layered dielectric pattern having a second thickness and also separated from the first gate pattern by a first portion of the first multi-layered dielectric pattern, but not a corresponding first portion of the second multi-layered dielectric pattern.

10. The nonvolatile memory device of claim 9, wherein the first portion of the first multi-layered dielectric pattern is a first metal oxide layer and the first portion of the second multi-layered dielectric layer is a second metal oxide layer.

11. The nonvolatile memory device of claim 10, wherein the first metal oxide layer contacts a lower surface of the first gate pattern and an upper surface of the second gate pattern.

12. The nonvolatile memory device of claim 9, wherein the first portion of the first multi-layered dielectric pattern is a first tunnel oxide layer and the first portion of the second multi-layered dielectric layer is a second tunnel oxide layer.

* * * * *